United States Patent
Cavallaro et al.

(10) Patent No.: US 11,416,040 B1
(45) Date of Patent: Aug. 16, 2022

(54) HINGED ELECTRONIC DEVICE WITH FLEXIBLE DISPLAY AND HEAT SPREADER

(71) Applicant: Motorola Mobility LLC, Chicago, IL (US)

(72) Inventors: Alberto R. Cavallaro, Northbrook, IL (US); Maninder Sehmbey, Hoffman Estates, IL (US); Yongho Lim, Kildeer, IL (US); Steve Emmert, McHenry, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 17/200,018

(22) Filed: Mar. 12, 2021

(51) Int. Cl.
*G06F 1/16* (2006.01)
*G06F 1/20* (2006.01)
*H05K 7/20* (2006.01)

(52) U.S. Cl.
CPC .......... *G06F 1/1681* (2013.01); *G06F 1/1652* (2013.01); *G06F 1/203* (2013.01); *H05K 7/20963* (2013.01)

(58) Field of Classification Search
CPC ...... G06F 1/1681; G06F 1/1652; G06F 1/203; H05K 7/20963
See application file for complete search history.

(56) References Cited

U.S. PATENT DOCUMENTS

| | | | |
|---|---|---|---|
| 10,054,990 B1 * | 8/2018 | Harmon | G06F 1/1681 |
| 10,359,241 B2 * | 7/2019 | Morrison | H05K 7/2039 |
| 10,469,635 B1 * | 11/2019 | Carlson | H04M 1/0277 |
| 10,480,225 B1 * | 11/2019 | Hsu | E05D 3/12 |
| 2009/0071632 A1 * | 3/2009 | Bryant | F28D 15/04 165/104.26 |
| 2013/0027886 A1 * | 1/2013 | Crooijmans | G06F 1/1624 361/704 |
| 2018/0284856 A1 | 10/2018 | Shah | |
| 2019/0041922 A1 * | 2/2019 | Kurma Raju | G06F 1/1647 |
| 2019/0069451 A1 | 2/2019 | Myers et al. | |
| 2019/0317572 A1 * | 10/2019 | North | G06F 1/203 |
| 2020/0356143 A1 * | 11/2020 | Oh | G06F 1/1616 |

* cited by examiner

*Primary Examiner* — Abhishek M Rathod
(74) *Attorney, Agent, or Firm* — Philip H. Burrus, IV

(57) ABSTRACT

An electronic device includes a first device housing coupled to a second device housing by a hinge. A heat spreader is coupled to the first device housing and the second device housing and spans the hinge. A flexible display coupled to the first device housing and the second device housing and spans the hinge. The heat spreader and the flexible display can be coupled to the first device housing and the second device housing, respectively, at different locations. Alternatively, the flexible display can be coupled to the heat spreader at a location that is collocated with the location at which the heat spreader is coupled to the first device housing and the second device housing, respectively.

20 Claims, 13 Drawing Sheets

HINGED ELECTRONIC DEVICE WITH FLEXIBLE DISPLAY AND HEAT SPREADER

BACKGROUND

Technical Field

This disclosure relates generally to electronic devices, and more particularly to hinged electronic devices.

Background Art

Portable electronic communication devices, especially smartphones, have become ubiquitous. People all over the world use such devices to stay connected. These devices have been designed in various mechanical configurations. A first configuration, known as a "candy bar," is generally rectangular in shape, has a rigid form factor, and has a display disposed along a major face of the electronic device. By contrast, a "clamshell" device has a mechanical hinge that allows one housing to pivot relative to the other.

Some consumers prefer candy bar devices, while others prefer clamshell devices. To satisfy the latter, it would thus be desirable to have an improved electronic device that not only provides a hinged construction but a more comfortable tactile experience for the user as well.

Figure 1:
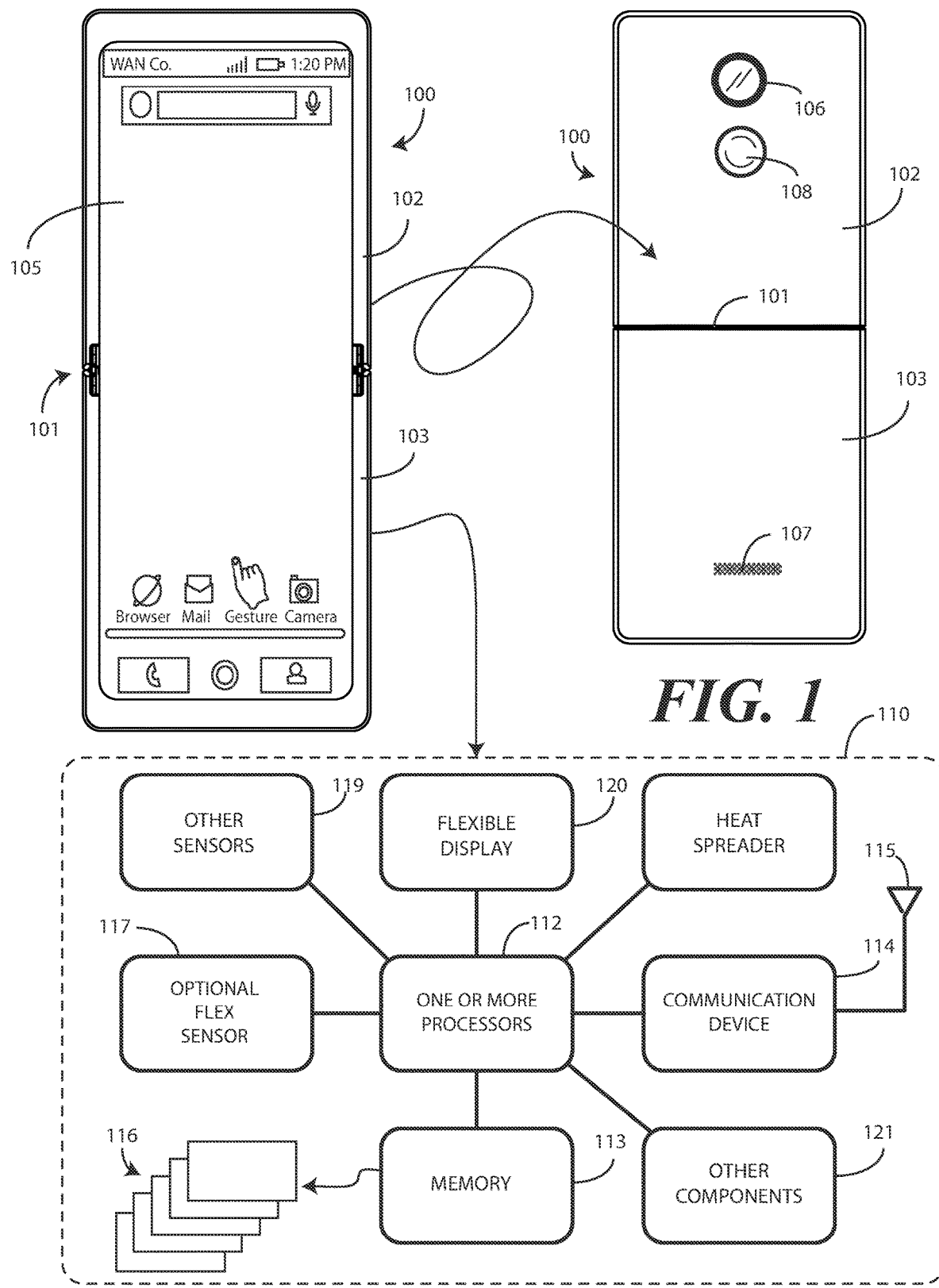
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Relational terms such as first and second, top and bottom, and the like may be used solely to distinguish one entity or action from another entity or action without necessarily requiring or implying any actual such relationship or order between such entities or actions. As used herein, components may be "operatively coupled" when information can be sent between such components, even though there may be one or more intermediate or intervening components between, or along the connection path.

The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide an electronic device that includes at least a first device housing and a second device housing. In one or more embodiments, a hinge couples the first device housing to the second device housing so that the first device housing is pivotable about the hinge relative to the second device housing to one or more of a bent configuration, a folded configuration, or other configuration.

In one or more embodiments, a flexible display is coupled to the first device housing and the second device housing and spans the hinge. The flexible display deforms when the first device housing pivots about the hinge relative to the second device housing.

In one or more embodiments, the hinge not only facilitates the bending operation, but also works to improve the reliability and usability of the flexible display. Illustrating by example, in one or more embodiments the hinge includes one or more support plates that are coupled to a hinge housing and are pivotable relative to the hinge housing when the first device housing pivots about the hinge relative to the second device housing.

In one or more embodiments, a first support plate is pivotally coupled to a first side of the hinge housing. The first support plate then extends distally into the first device housing from the first side of the hinge housing. Similarly, a second support plate is pivotally coupled to a second side of the hinge housing. The second support plate extends distally into the second device housing from the second side of the hinge housing.

The hinge housing and its corresponding support plates serve two functions. First, they provide mechanical support for the flexible display when the first device housing has pivoted about the hinge relative to the second device housing to an axially displaced open position. However, when the first device housing pivots about the hinge relative to the second device housing to a closed position, in which interior surfaces of the first device housing and the second device housing abut, the support plates translate along inclined planes within the first device housing and second device housing, respectively, to recede into the first device housing and second device housing. Said differently, when the first device housing pivots about the hinge relative to the second device housing to the closed position, the support plates move toward the exterior surfaces of the first device housing and the second device housing, thereby receding "outward" from the interior surfaces of the first device housing and the second device housing. This "collapse" of the first support plate and the second support plate creates a cavity in the hinge portion of the electronic device that allows the flexible display to form a service loop when the electronic device is in the closed position. The service loop prevents the flexible display from being damaged or developing memory in the folded position when the electronic device is in the closed position.

Heat generating electronics, including one or more processors, one or more memory devices, communication circuits, energy storage devices, power conversion circuits, and other devices can be situated within one or both of the first device housing and/or the second device housing. In this way, the first device housing and second device housing can each be considered to be a "packaging section" housing these heat generating electronics. The hinge separates these packaging sections. Within packaging section, the heat generating electronics generate heat. However, embodiments of the disclosure contemplate a complex hinge, such as one including support plates extending distally therefrom, is an ineffective thermal conductor. For this reason, each packaging section is unable to effectively spread the heat generated within across all of the available surfaces of the composite electronic device. Advantageously, embodiments of the disclosure provide a solution to this problem by providing a thermal spreading mechanism that not only allows the first display to bend and define its service loop, but that also spreads thermal energy across the hinge.

In one or more embodiments, an electronic device includes a first device housing coupled to a second device housing by a hinge. The first device housing is pivotable about the hinge relative to the second device housing between a closed position and an axially displaced open position. The first device housing defines a first chamber adjoining a first support surface at a first juncture, while the second device housing defines a second chamber adjoining a second support surface at a second juncture.

In one or more embodiments, a flexible display is mechanically attached to the first device housing and the second device housing such that the flexible display spans the hinge. Illustrating by example, in one or more embodiments the flexible display is mechanically attached to the first support surface a first distance from the first juncture. The flexible display is then mechanically attached to the second support surface a second distance from the second juncture. When the first device housing pivots about the hinge relative to the second device housing from the axially displaced open position to the closed position, the flexible display defines a service loop within an amalgamate chamber defined by the first chamber and the second chamber.

In one or more embodiments, to transfer thermal energy from one device housing to the other, the electronic device comprises a heat spreader spanning the hinge. In one or more embodiments, the heat spreader is attached to the first support surface a third distance from the first juncture. In one or more embodiments, the heat spreader is then attached to the second support surface a fourth distance from the second juncture. In one or more embodiments, the heat spreader is positioned beneath the first display, but above the hinge. Said differently, in one or more embodiments the heat spreader is positioned between the first display and the hinge.

The heat spreader can be manufactured from a variety of thermally conductive materials. In an illustrative embodiment, the heat spreader is manufactured from a carbon-based film, and is attached to the first support surface and the second support surface by a thermally conductive adhesive. In one or more embodiments, when the first device housing pivots about the hinge relative to the second device housing from the axially displaced open position to the closed position, the heat spreader defines a service loop around the service loop defined by the flexible display within the amalgamate chamber defined by the first chamber and the second chamber In one or more embodiments, the attachment locations to the first device housing and the second device housing for the flexible display and the heat spreader are different. Embodiments of the disclosure have demonstrated that the bending cycle life of the flexible display, i.e., the number of times the flexible display can be deformed into the service loop and back to a substantially planar condition without unsatisfactory degradations in performance, can be increased by coupling the flexible display to the first device housing and second device housing, respectively, at locations farther from the hinge that the locations to which the heat spreader is attached. Illustrating by example, in one or more embodiments the third distance and fourth distance from the hinge where the heat spreader is attached to the first support surface and the second support surface, respectfully, is less than the first distance and the second distance at which the flexible display is attached to the first support surface and the second support surface, respectfully.

In one or more embodiments, this allows at least a portion of the flexible display to separate from the first support surface within the first distance from the first juncture, and allows at least another portion of the flexible display to separate from the second support surface within the second distance from the second juncture, when the first device housing and the second device housing pivot to the closed position. This separation advantageously extends the mechanical service life of the flexible display. Moreover, simulation has shown that the inclusion of the heat spreader advantageously spreads enough thermal energy from the first device housing to the second device housing, or vice versa, so as to lower the temperature of a device housing heat generating electronics dissipating 2.6 Watts by approximately 2.5 degrees centigrade. Other advantages offered by embodiments of the disclosure will be explained below. Still others will be obvious to those of ordinary skill in the art having the benefit of this disclosure.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other devices as well, including tablet computers, gaming devices, multimedia players, and so forth. Still other types of electronic devices can be configured in accordance with one or more embodiments of the disclosure as will be readily appreciated by those of ordinary skill in the art having the benefit of this disclosure.

The electronic device 100 includes a first device housing 102 and a second device housing 103. In one or more embodiments, a hinge 101 couples the first device housing 102 to the second device housing 103. In one or more embodiments, the first device housing 102 is selectively pivotable about the hinge 101 relative to the second device housing 103. For example, in one or more embodiments the first device housing 102 is selectively pivotable about the hinge 101 between a closed position, shown and described below with reference to FIG. 2, and an axially displaced open position, shown and described below with reference to FIGS. 4-5.

In one or more embodiments the first device housing 102 and the second device housing 103 are manufactured from a rigid material such as a rigid thermoplastic, metal, or composite material, although other materials can be used. In one illustrative embodiment, each of the first device housing 102 and the second device housing 103 is manufactured from a thermally conductive material. Illustrating by example, in one illustrative embodiment the first device housing 102 and the second device housing 103 are manufactured from aluminum. The use of a thermally conductive material advantageously allows for thermal energy generated by heat generating electronics situated within one or both of the first device housing 102 or the second device housing 103 to be distributed along the surfaces of the first device housing 102 or second device housing 103 for radiative cooling to the environment. Still other constructs will be obvious to those of ordinary skill in the art having the benefit of this disclosure.

In the illustrative embodiment of FIG. 1, the electronic device 100 includes a single hinge 101. However, in other embodiments two or more hinges can be incorporated into the electronic device 100 to allow it to be folded in multiple locations.

This illustrative electronic device 100 of FIG. 1 includes a display 105. The display 105 can optionally be touch-sensitive. Users can deliver user input to the display 105 of such an embodiment by delivering touch input from a finger, stylus, or other objects disposed proximately with the display 105.

In one embodiment, the display 105 is configured as an organic light emitting diode (OLED) display fabricated on a flexible plastic substrate, thereby making the display 105 a flexible display 120. This allows the display 105 to be flexible so as to deform when the first device housing 102 pivots about the hinge 101 relative to the second device housing 103. When a flexible display 120 is used, in one or more embodiments an OLED is constructed on flexible plastic substrates can allow the flexible display 120 to bend with various bending radii.

In one or more embodiments the flexible display 120 may be formed from multiple layers of flexible material such as flexible sheets of polymer or other materials. In this illustrative embodiment, the flexible display 120 is fixedly coupled to the first device housing 102 and the second device housing 103. The flexible display 120 spans the hinge 101 in this illustrative embodiment.

Features can be incorporated into the first device housing 102 and/or the second device housing 103. Examples of such features include a camera 106 or an optional speaker port 107, which are shown disposed on the rear side of the electronic device 100 in this embodiment but could be placed on the front side as well. In this illustrative embodiment, a user interface component 108, which may be a button, fingerprint sensor, or touch sensitive surface, can also be disposed along the rear side of the first device housing 102. As noted, any of these features are shown being disposed on the rear side of the electronic device 100 in this embodiment, but could be located elsewhere, such as on the front side in other embodiments. In other embodiments, these features may be omitted.

A block diagram schematic 110 of the electronic device 100 is also shown in FIG. 1. The block diagram schematic 110 includes one or more heat generating electronics components that can be coupled to a printed circuit board assembly disposed within either or both of the first device housing 102 or the second device housing 103 of the electronic device 100. The heat generating (and non-heat generating) components can be electrically coupled together by conductors or a bus disposed along one or more printed circuit boards. For example, some components of the block diagram schematic 110 can be configured as a first electronic circuit fixedly situated within the first device housing 102, while other components of the block diagram schematic 110 can be configured as a second electronic circuit fixedly situated within the second device housing 103. In one or more embodiments, the heat generating electronics components are thermally coupled to the device housing in which they are situated so as to transfer thermal energy from the electronic components to their respective device housing. As will be described in more detail below, a flexible substrate can then span the hinge 101 to electrically couple the first electronic circuit to the second electronic circuit.

In one or more embodiments, the electronic device 100 includes one or more processors 112. In one embodiment, the one or more processors 112 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 113, can optionally store the executable software code used by the one or more processors 112 during operation.

In this illustrative embodiment, the electronic device 100 also includes a communication circuit 114 that can be configured for wired or wireless communication with one or more other devices or networks. The networks can include a wide area network, a local area network, and/or personal area network. The communication circuit 114 may also utilize wireless technology for communication, such as, but are not limited to, peer-to-peer or ad hoc communications such as HomeRF, Bluetooth and IEEE 802.11, and other forms of wireless communication such as infrared technology. The communication circuit 114 can include wireless communication circuitry, one of a receiver, a transmitter, or transceiver, and one or more antennas 115.

In one embodiment, the one or more processors 112 can be responsible for performing the primary functions of the electronic device 100. For example, in one embodiment the one or more processors 112 comprise one or more circuits operable with one or more user interface devices, which can include the display 105, to present, images, video, or other presentation information to a user. The executable software code used by the one or more processors 112 can be configured as one or more modules 116 that are operable with the one or more processors 112. Such modules 116 can store instructions, control algorithms, logic steps, and so forth.

In one embodiment, the one or more processors 112 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100. The application layer can be responsible for executing application service modules. The application service modules may support one or more applications or "apps." The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

Figure 2:
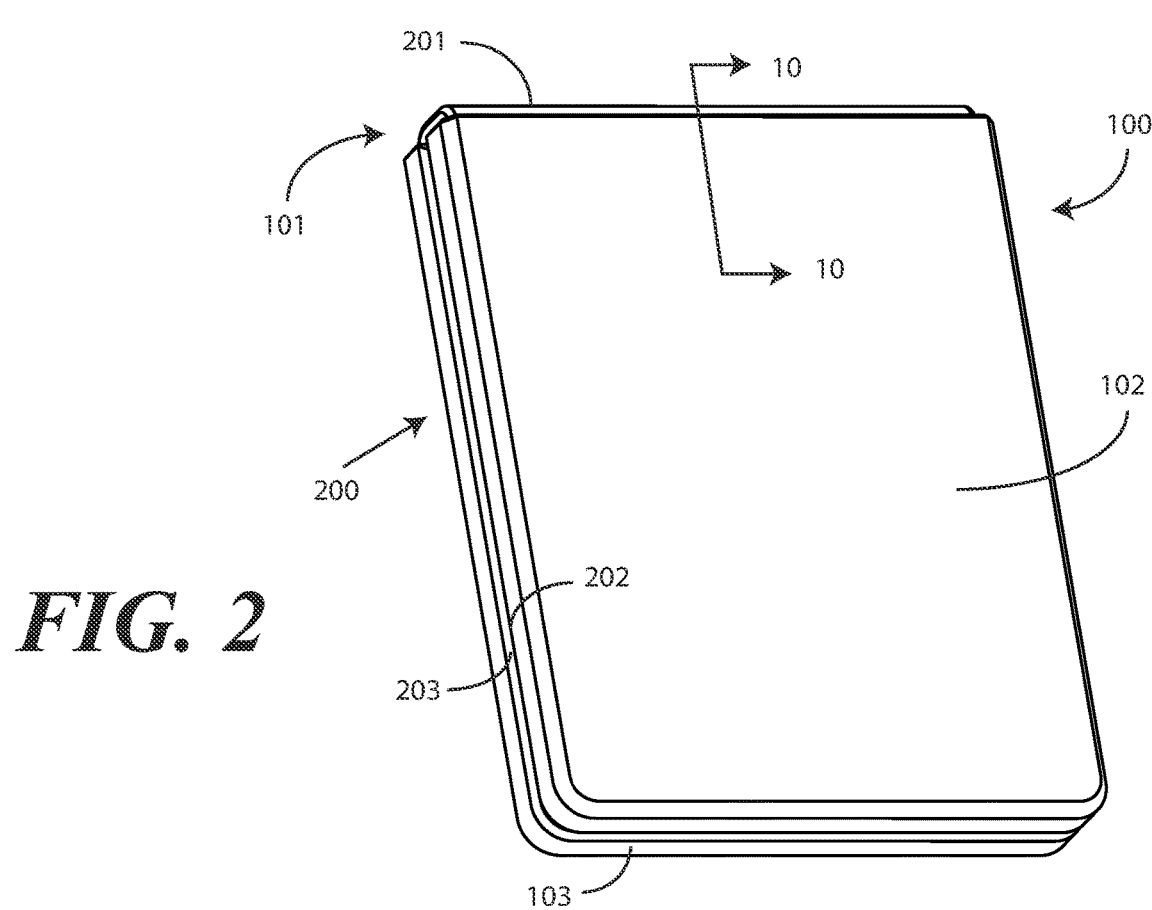
FIG. 2 illustrates a perspective view of one explanatory electronic device in accordance with one or more embodiments of the disclosure in a closed position.
Figure 3:
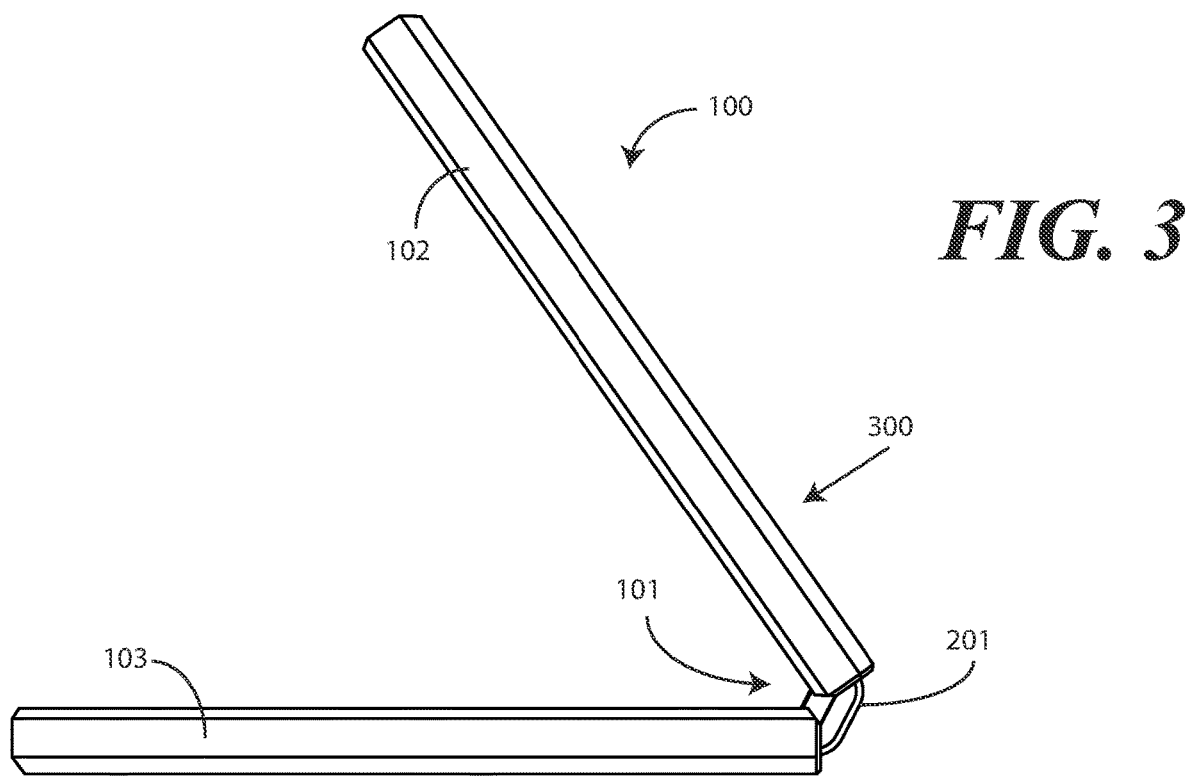
FIG. 3 illustrates a side elevation view of one explanatory electronic device in accordance with one or more embodiments of the disclosure in a partially open position.

In one embodiment, the electronic device 100 optionally includes one or more flex sensors 117, operable with the one or more processors 112, to detect a bending operation that causes the first device housing 102 to pivot about the hinge 101 relative to the second device housing 103, thereby transforming the electronic device 100 into a deformed geometry, such as that shown in FIGS. 2-3. The inclusion of flex sensors 117 is optional, and in some embodiment flex sensors 117 will not be included.

In one embodiment, the one or more processors 112 may generate commands or execute control operations based on information received from the various sensors, including the one or more flex sensors 117, the flexible display 120, or the other sensors 119. The one or more processors 112 may also generate commands or execute control operations based upon information received from a combination of the one or more flex sensors 117, the flexible display 120, or the other sensors 119. Alternatively, the one or more processors 112 can generate commands or execute control operations based upon information received from the one or more flex sensors 117 or the flexible display 120 alone. Moreover, the one or more processors 112 may process the received information alone or in combination with other data, such as the information stored in the memory 113.

The one or more other sensors 119 may include a microphone, an earpiece speaker, a second loudspeaker (disposed beneath speaker port 107), and a user interface component such as a button or touch-sensitive surface. The one or more other sensors 119 may also include key selection sensors, proximity sensors, a touch pad sensor, a touch screen sensor, a capacitive touch sensor, and one or more switches. Touch sensors may used to indicate whether any of the user actuation targets present on the display 105 are being actuated. Alternatively, touch sensors disposed in the electronic device 100 can be used to determine whether the electronic device 100 is being touched at side edges or major faces of the first device housing 102 or the second device housing 103. The touch sensors can include surface and/or housing capacitive sensors in one embodiment. The other sensors 119 can also include audio sensors and video sensors (such as a camera).

The other sensors 119 can also include motion detectors, such as one or more accelerometers or gyroscopes. For example, an accelerometer may be embedded in the electronic circuitry of the electronic device 100 to show vertical orientation, constant tilt and/or whether the electronic device 100 is stationary. A gyroscope can be used in a similar fashion.

Other components 121 operable with the one or more processors 112 can include output components such as video outputs, audio outputs, and/or mechanical outputs. Examples of output components include audio outputs such as speaker port 107, earpiece speaker, or other alarms and/or buzzers and/or a mechanical output component such as vibrating or motion-based mechanisms. Still other components will be obvious to those of ordinary skill in the art having the benefit of this disclosure.

It is to be understood that FIG. 1 is provided for illustrative purposes only and for illustrating components of one electronic device 100 in accordance with embodiments of the disclosure and is not intended to be a complete schematic diagram of the various components required for an electronic device. Therefore, other electronic devices in accordance with embodiments of the disclosure may include various other components not shown in FIG. 1 or may include a combination of two or more components or a division of a particular component into two or more separate components, and still be within the scope of the present disclosure. Illustrating by example, as will be described in more detail below, some embodiments include support plates that are pivotally coupled to a hinge housing of the hinge 101. In other embodiments, these support plates will be omitted.

Turning now to FIG. 2, illustrated therein is the electronic device 100 in a closed state. In this state, the first device housing 102 has been pivoted about the hinge 101 toward the second device housing 103 to a closed position 200. When in the closed position 200, a front surface 202 of the first device housing 102 abuts a front surface 203 of the second device housing 103. Additionally, in this illustrative embodiment, a hinge housing 201 comprising the hinge 101 is revealed when the electronic device 100 is in the closed position 200. In other embodiments, the hinge housing 201 will remain concealed when the first device housing 102 pivots about the hinge 101 relative to the second device housing 103 to the closed position 200. Effectively, in either embodiment, the first device housing 102 and the second device housing 103 are analogous to clam shells that have been shut by the clam, thereby giving rise to the "clamshell" style of device. When the clamshell opens, the flexible display (120) is revealed.

In some embodiments, features can be included to further retain the electronic device 100 in the closed position 200. Illustrating by example, in another embodiment, a mechanical latch can be included to retain the first device housing 102 and the second device housing 103 in the closed position 200.

In still another embodiment, magnets can be incorporated into the front surface 202 of the first device housing 102 and the front surface 203 of the second device housing 103. For instance, magnets can be placed in the first device housing 102 and the second device housing 103 to retain the first device housing 102 and the second device housing 103 in the closed position 200.

In still other embodiments, frictional elements can be incorporated into the hinge 101 to retain the first device housing 102 and the second device housing 103 in a particular position. A stator motor could be integrated into the hinge 101 as well. Still other mechanical structures and devices suitable for retaining the electronic device 100 in the closed position 200 will be obvious to those of ordinary skill in the art having the benefit of this disclosure.

Turning now to FIG. 3, the electronic device 100 is shown being transitioned from the closed position (200) of FIG. 2 to a partially open position 300. Specifically, the first device housing 102 is pivoting about the hinge 101 away from the second device housing 103 toward an open position. The open position 300 shown in FIG. 3 is a "tent position." In the side elevation view of FIG. 3, the hinge housing 201 is exposed between the first device housing 102 and the second device housing 103.

Figures 4, 5:
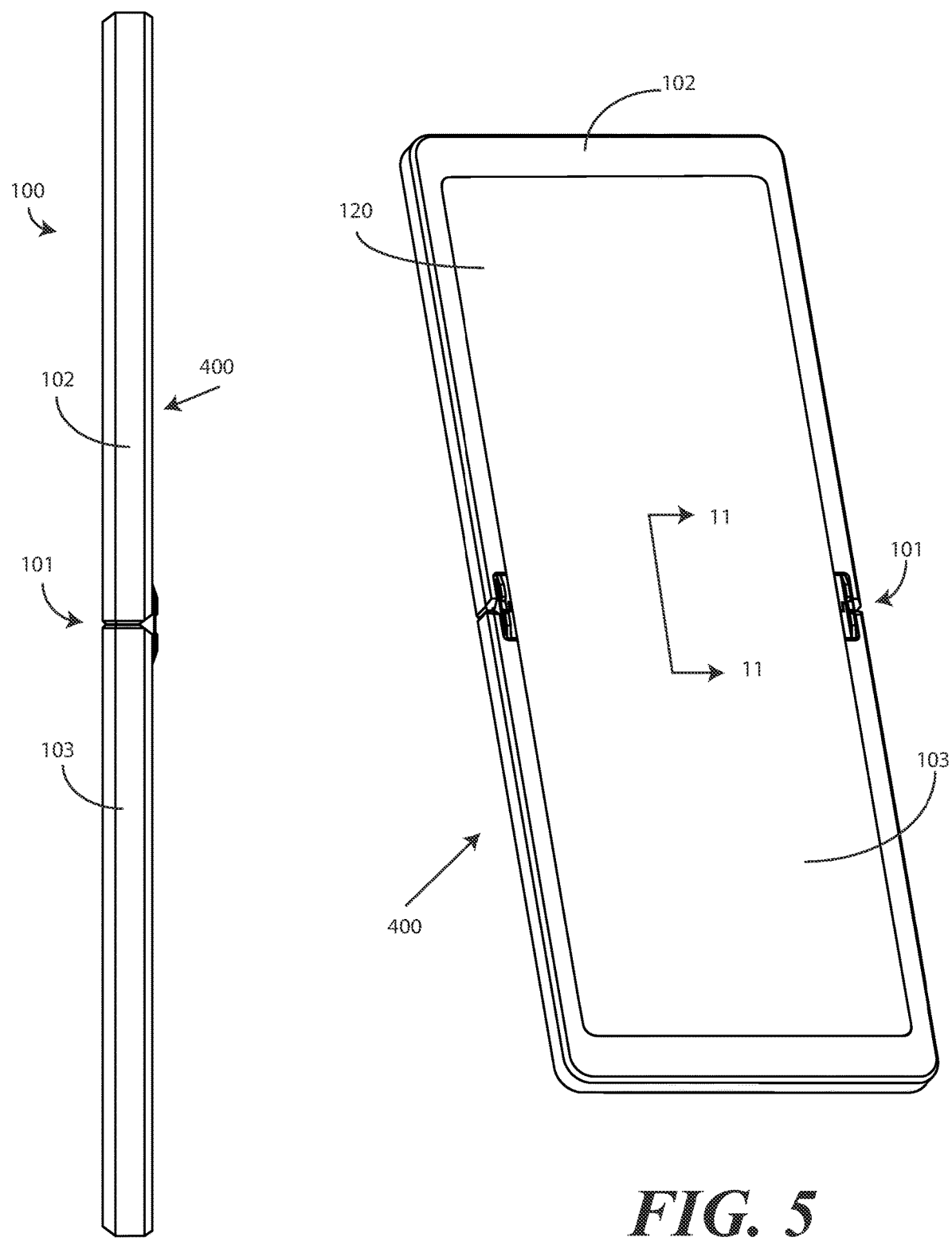
FIG. 4 illustrates a side elevation view of one explanatory electronic device in accordance with one or more embodiments of the disclosure in an axially displaced open position.
FIG. 5 illustrates a perspective view of one explanatory electronic device in accordance with one or more embodiments of the disclosure in the axially displaced open position.

Turning now to FIGS. 4 and 5, illustrated therein is the electronic device 100 in an axially displaced open position 400. In the axially displaced open position 400, the first device housing 102 is rotated about the hinge 101 so as to be axially displaced 180-degrees out of phase with the second device housing 103, thereby revealing the flexible display 120 of this embodiment. In this illustrative embodiment, this causes the hinge housing (201) to be concealed within the first device housing 102 and second device housing 103.

In such a configuration, the first device housing 102 and the second device housing 103 effectively define a plane. Since this illustrative embodiment includes a flexible display 120, the flexible display 120 has been elongated into a flat position.

Figure 6:
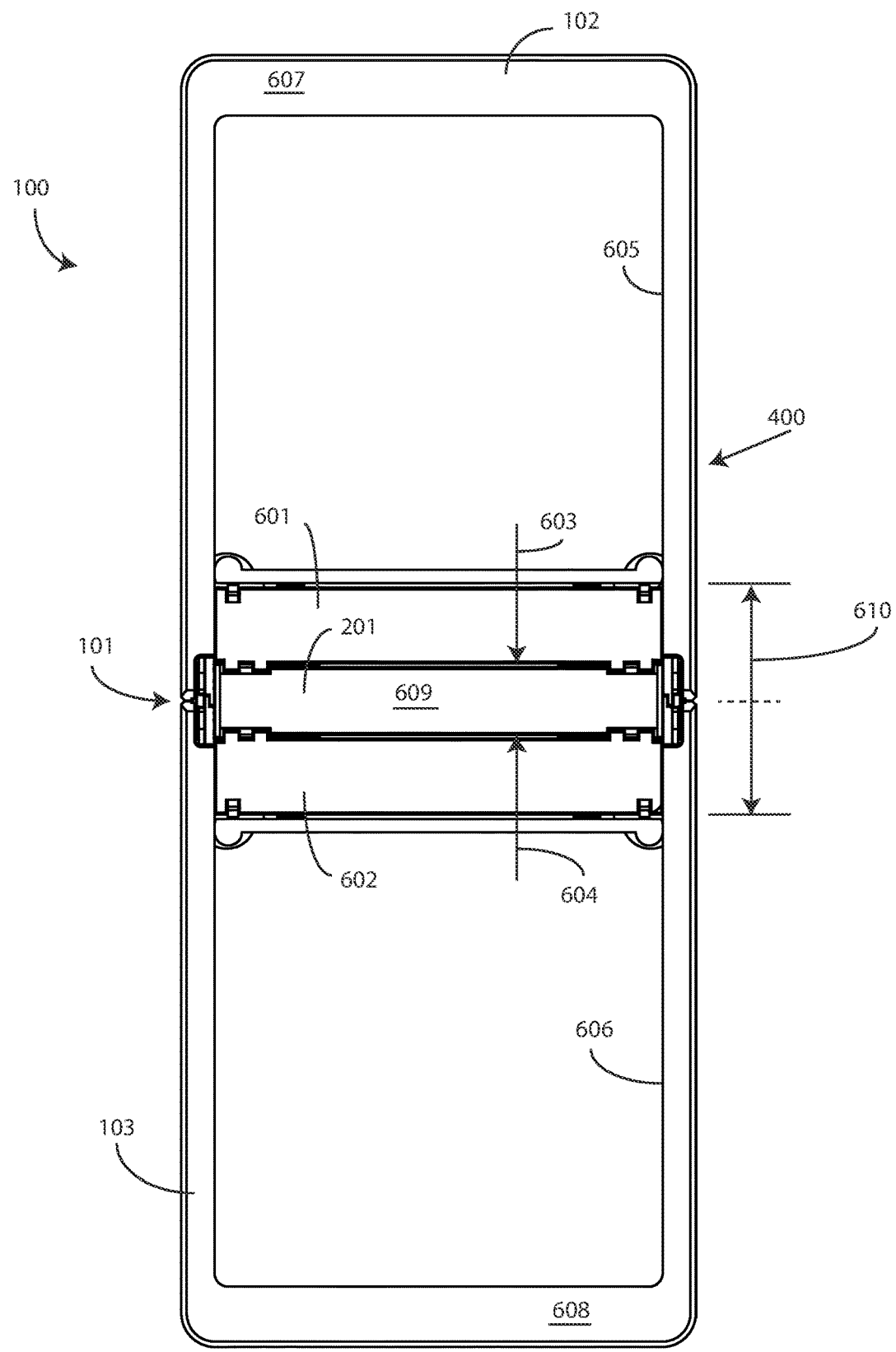
FIG. 6 illustrates a plan view of one explanatory electronic device in accordance with embodiments of the disclosure with the flexible display removed so that the hinge is visible.

Turning now to FIG. 6, the electronic device 100 is shown with the flexible display (120), as well as any overlaying fascia, removed so that additional details of the hinge 101 can more readily be seen. As shown in FIG. 6, in one or more embodiments the hinge 101 includes a hinge housing 201, which can link the first device housing 102 to the second device housing 103. The hinge 101 of the hinge housing 201 can further include one or more pivots allowing the first device housing 102 to pivot about the hinge 101, which is operatively coupled to the hinge housing 201, relative to the second device housing 103.

Optionally, as will be described in more detail below, one or more support plates can be included to translate within the first device housing 102 and the second device housing 103, respectively. The use of such support plates is advantageous when the flexible display (120) used in the electronic device 100. However, in other embodiments the support plates can be omitted.

In this illustrative embodiment, a first support plate 601 is pivotally coupled to a first side 603 of the hinge housing 201. The first support plate 601 extends distally into the first device housing 102 from the first side 603 of the hinge housing 201. A second support plate 602 is then pivotally coupled to a second side 604 of the hinge housing 201. The second support plate 602 then extends distally into the second device housing 103 from the second side 604 of the hinge housing 201.

In one or more embodiments, the first device housing 102 and the second device housing 103 each define linear recesses 605,606 into which the flexible display (120) may be positioned. In one or more embodiments, the flexible display (120) is positioned within the linear recess 605 of the first device housing 102 and the linear recess 606 of the second device housing 103 so that it—or a fascia disposed atop the flexible display (120)—sits flush with the interior surface 607 of the first device housing 102 and the interior surface 608 of the second device housing 103. Where a flexible display (120) is used, the flexible display (120) will span the hinge 101 by passing across the hinge housing 201 in such an embodiment.

In other embodiments, the linear recess 605,606 will be omitted. The display, as well as any accompanying fascia, may then simply sit atop planar surfaces defined by the interior surface 607 of the first device housing 102 and the interior surface 608 of the second device housing 103.

Where the linear recesses 605,606 are included, the flexible display (120) can be positioned within these linear recesses 605,606 to span the hinge 101 and hinge housing 201. Regardless of whether the linear recesses 605,606 are included, when the first device housing 102 pivots about the hinge 101 and hinge housing 201 relative to the second device housing 103 to the axially displaced open position 400 shown in FIG. 6, the first support plate 601, the hinge housing 201, and the second support plate 602 bridge the linear recesses 605,606 (or planar interior surfaces in the other embodiment) to provide positive mechanical support for the flexible display (120).

Where electrical components, e.g., processors, memories, communication circuits, and other components described in the block diagram schematic (110) of FIG. 1 are positioned in each of the first device housing 102 and the second device housing 103, a flexible substrate can be included to electrically couple these components together across the hinge 101 and through the hinge housing 201. Illustrating by example, as will be shown below in FIGS. 10-11, in one or more embodiments the hinge housing 201 can include a crescent shaped duct through which the flexible substrate can pass. In one or more embodiments, the flexible substrate, which can bend as the first device housing 102 and the second device housing 103 pivot about the hinge 101 to the closed position (200) of FIG. 2, allows electrical signals to pass back and forth between circuit components disposed in the first device housing 102 and the second device housing 103.

In one or more embodiments, one or more spring-loaded trays can be included within one or both of the first device housing 102 or the second device housing 103. Illustrating by example, a spring-loaded and slidable tray can be disposed within the first device housing 102. One example of such a solution is described in commonly assigned U.S. Pat. No. 10,491,725 to Harmon et al., entitled "Hinged Electronic Device with Moving Support Plates for a Flexible Display and Corresponding Systems," which is incorporated herein by reference. Alternatively, the tray could be disposed in the second device housing 103. Additionally, in other embodiments both the first device housing 102 and the second device housing 103 could include trays as well.

In one or more embodiments, a first end of a flexible display (120) can be fixedly coupled to the second device housing 103. The second end of the flexible display (120) can then be coupled to the sliding tray. In one or more embodiments, the tray is slidably coupled to the first device housing 102 and is biased away from the hinge 101 and hinge housing 201 by a spring. It should be noted that while a spring is used to bias the tray away from the hinge 101 and hinge housing 201 in some embodiments, in other embodiments the spring can be replaced by a damper device or other equivalent. Where configured as a damper device, the damper device can include a spring with a nested shock damper, which can be pneumatic or hydraulic, to dampen the action of the spring. Other devices suitable for use instead of the spring will be obvious to those of ordinary skill in the art having the benefit of this disclosure.

Where a tray is included, the spring(s) can operably bias the tray away from the hinge 101 to flatten the flexible display (120) when the first device housing 102 pivots about the hinge 101 away from the second device housing 103 to the open position 400. A first end of the flexible display (120) can be coupled to the second device housing 103, while a second end is coupled to the tray. In one or more embodiments, the spring biases the tray away from the hinge 101, and thus away from the second device housing 103, to remove slack from the flexible display (120) when the first device housing 102 is pivoted about the hinge 101 toward the second device housing 103 to the closed position (200) of FIG. 2.

While inclusion of a spring-loaded tray is one design option, testing has shown that the inclusion of a tray, with one end of the display (105) coupled thereto, can cause a flexible display (120) to "feel" like its moving when a user is delivering user input to the flexible display (120). To eliminate this tactile artifact, and to provide for more display stability when a user is interacting with the flexible display (120) with a finger or stylus, in the illustrative embodiment of FIG. 6 the hinge 101 is configured to alter a displacement 610 between the hinge housing 201 and the first device housing 102 and second device housing 103, respectively, when the first device housing 102 and the second device housing 103 pivot about the hinge housing 201 between the axially displaced open position 400 of FIG. 6 and the closed position (200) of FIG. 2. Advantageously, this changing of the displacement 610 eliminates the need for any spring-loaded tray, as it allows the flexible display (120) to be fixedly coupled to the first device housing 102 and the second device housing 103, respectively. Moreover, the flexible display (120) is able to fully extend when the electronic device 100 is in the axially displaced open position 400 of FIG. 6, while still forming a proper service loop (shown, for example in FIG. 9 below) when the electronic device 100 is in the closed position (200).

Effectively, the hinge 101 of FIG. 6 causes the hinge housing 201 to get closer to the interior ends of the first device housing 102 and second device housing 103, respectively, when the electronic device 100 is in the axially displaced open position 400, while moving the hinge housing 201 farther from these interior ends of the first device housing 102 and second device housing 103, respectively, when the electronic device 100 is in the closed position (200). This changing distance, represented by displacement 610 in FIG. 6, compensates for the difference between the length of the flexible display (120) that bends when the first device housing 102 pivots about the hinge 101 relative to the second device housing 103 to the closed position (200) and the length of the mechanical mechanism supporting the flexible display (120) that is defined by the first support plate 601, the second support plate 602, and the hinge housing 201. This change in displacement 610 causes an interior surface 609 of the hinge housing 201 to be positioned farther from the first device housing 102 and the second device housing 103, respectively, when the first device housing 102 is pivoted about the hinge housing 201 relative to the second device housing 103 to the closed position (200) than when the first device housing 102 is pivoted about the hinge housing 201 relative to the second device housing 103 to the axially displaced open position 400.

Figure 7:
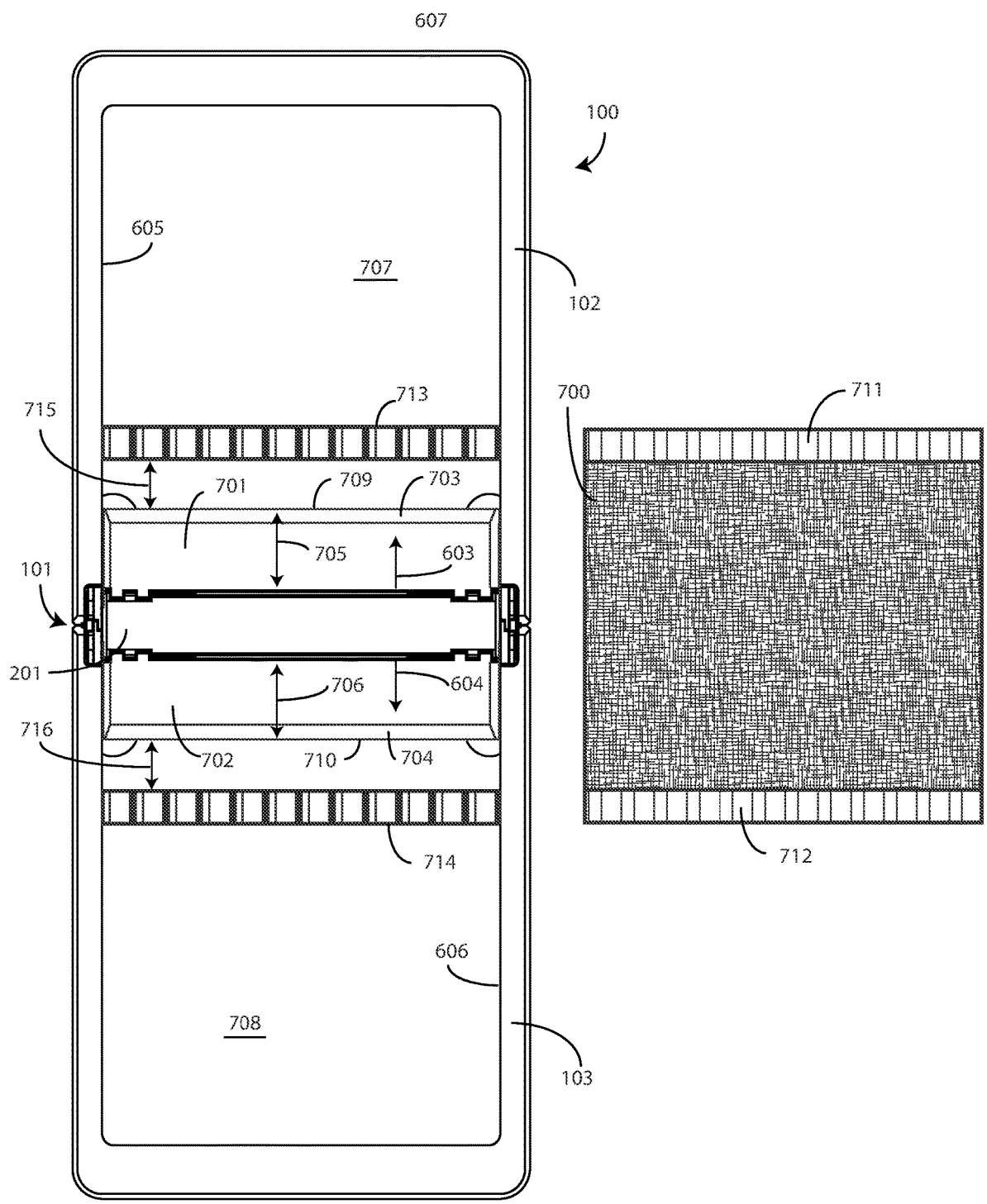
FIG. 7 illustrates a plan view of one explanatory electronic device with a heat spreader in accordance with embodiments of the disclosure.

Turning now to FIG. 7, illustrated therein is another view of the electronic device 100 is shown with the first support plate (601) and the second support plate (602) removed so that additional details of the first device housing 102 and the second device housing 103 can more readily be seen. As shown in FIG. 7, in one or more embodiments each of the first device housing 102 and the second device housing 103 define a first chamber 701 and a second chamber 702, respectively.

In this illustrative embodiment, the first chamber 701 of the first device housing 102 is disposed to a first side 603 of the hinge housing 201, while the second chamber 702 of the second device housing 103 is disposed to the second side 604 of the hinge housing 201. The hinge housing 201 then separates the first chamber 701 defined by the first device housing 102 from the second chamber 702 defined by the second device housing 103.

In one or more embodiments, the first chamber 701 and the second chamber 702 provide recessed, open space within the first device housing 102 and the second device housing 103, respectively, that allows the flexible display (120) room to form a service loop when the first device housing 102 and the second device housing 103 pivot about the hinge 101 to the closed position (200). One example of such a service loop will be shown below with reference to FIG. 9. This service loop occurs due to the fact that the flexible display (120) deforms when the first device housing 102 pivots about the hinge 101 relative to the second device housing 103 from the axially displaced open position 400 to the closed position (200).

In one or more embodiments, each of the first chamber 701 and the second chamber 702 comprises an inclined plane 703,704. In this illustrative embodiment, the first chamber 701 defines an inclined plane 703 that is disposed distally a predefined distance 705 across a bottom surface of the first chamber 701 from the hinge housing 201. Similarly, the second chamber 702 defines an inclined plane 704 that is disposed distally a predefined distance 706 across a bottom surface of the second chamber 702 from the hinge housing 201.

In this illustrative embodiment, the first device housing 102 and the second device housing 103 each defines linear recesses 605,606 into which a flexible display (120) may be positioned. In one or more embodiments, the linear recesses 605,606 bound support surfaces 707,708 against which the flexible display (120) may be positioned and/or to which the flexible display (120) may be mechanically attached.

In the illustrative embodiment of FIG. 7, the first support surface 707 joins the first chamber 701 defined by the first device housing 102 at a first juncture 709. The first juncture 709 is defined by the intersection of the first inclined plane 703 of the first chamber 701 and the first support surface 707 in this illustrative embodiment. Similarly, the second support surface 708 joins the second chamber 702 defined by the second device housing 103 at a second juncture 710. The second juncture 710 is defined by the intersection of the second inclined plane 704 of the second chamber 702 and the second support surface 708 in this illustrative embodiment.

In one or more embodiments, each of the first chamber 701 and the second chamber 702 is disposed between a respective linear recess 605,606 and the hinge 101. For example, in this illustrative embodiment the first chamber 701 of the first device housing 102 is disposed between the linear recess 605 of the first device housing 102 and the hinge 101. Similarly, the second chamber 702 of the second device housing 103 is disposed between the linear recess 606 of the second device housing 103 and the hinge 101.

While shown as flat surfaces spanning the width of the first chamber 701 and the second chamber 702, respectively, in FIG. 7, it should be noted that the inclined planes 703,704 could be augmented with, or replaced by, other inclined plane structures. Illustrating by example, in some embodiments each of the first support plate (601) and the second support plate (602) is bounded by one or more inclined apertures within which posts extending distally from the edges of the first support plate (601) and second support plate (602) insert. This configuration latches and retains the posts within the inclined apertures, thereby defining an enclosed track within which the posts may travel as the electronic device 100 pivots between the axially displaced open position (400) and the closed position (200). In other embodiments the inclined apertures will be omitted. In still other embodiments, the inclined apertures will replace the inclined planes. Other configurations by which the first support plate (601) and the second support plate (602) are directed into the first chamber 701 and the second chamber 702, respectively, as the first device housing 102 pivots about the hinge 101 relative to the second device housing 103 to the closed position (200) will be obvious to those of ordinary skill in the art having the benefit of this disclosure.

Shown to the side of the electronic device 100 in FIG. 7 is a heat spreader 700. The heat spreader 700 is a thermal conduit configured to transfer heat from one of the first device housing 102 or the second device housing 103 to another of the first device housing 102 or the second device housing 103. In one or more embodiments, the heat spreader 700 is manufactured from a thermally conductive material. In one or more embodiments, the heat spreader 700 is manufactured from a flexible thermally conductive material. In one or more embodiments, the heat spreader 700 is devoid of metallic elements, as they may deteriorate during bending when the first device housing 102 pivots relative to the second device housing 103 about the hinge 101. Illustrating by example, in one or more embodiments the heat spreader 700 is devoid of copper and is manufactured from a carbon-based film. In one or more embodiments, the heat spreader 700 is manufactured from a flexible graphite film having a thickness of about sixty micrometers. Other examples of materials suitable for use as the heat spreader 700 will be obvious to those of ordinary skill in the art having the benefit of this disclosure.

In one or more embodiments, a first side of the heat spreader 700 is mechanically attached to the first support surface 707 of the first device housing 102 by a thermally conductive adhesive 711 at a first heat spreader attachment location 713. Similarly, a second side of the heat spreader 700 can be mechanically attached to the second support surface 708 of the second device housing 103 by a thermally conductive adhesive 712 at a second heat spreader attachment location 714. In one or more embodiments, the thermally conductive adhesive 711,712 has a thickness of about fifty micrometers. Other thicknesses for the thermally conductive adhesive 711,712 will be obvious to those of ordinary skill in the art having the benefit of this disclosure.

In one or more embodiments, the width of the heat spreader 700 is maximized to the extent possible given the physical geometries of the first device housing 102 and the second device housing 103. Illustrating by example, in this illustrative embodiment the first device housing 102 and the second device housing 103 each define linear recesses 605,606 into which the heat spreader 700 may be positioned. In one or more embodiments, to maximize the width of the heat spreader 700, this width is configured to equal to that of the linear recesses 605,606 so that the heat spreader 700 fully spans the first support surface 707 and the second support surface 708. Where the linear recesses 605,606 are omitted, or where the geometry of the first device housing 102 and the second device housing 103 allows, the width of the heat spreader 700 may be wider.

Embodiments of the disclosure contemplate that maximizing the width of the heat spreader 700 within the limitations of the first device housing 102 and the second device housing 103 can be beneficial due to the fact that the major surfaces of the heat spreader 700, in addition to functioning as a heat transfer device, also function as a heat dissipation device. Since these major faces dissipate heat, the larger they are the more heat they will dissipate. Said differently, while a narrow heat spreader can also be used to transfer heat between the first device housing 102 and the second device housing 103 via a combination of the thermal conductivity and its thickness, it would not dissipate as much heat due to the fact that the width of its major surfaces is narrower than it could be within the limitations of the physical design of the first device housing 102 and the second device housing 103. Accordingly, in one or more embodiments the width of the heat spreader 700 is maximized within the physical limitations of the first device housing 102 and the second device housing 103. In the illustrative embodiment of FIG. 7, the physical form factor constraints limit the width of the heat spreader by way of the linear recesses 605,606.

When the first side of the heat spreader 700 is mechanically attached to the first support surface 707 of the first device housing 102 at the first heat spreader attachment location 713 and the second side of the heat spreader 700 is mechanically attached to the second support surface 708 of the second device housing 103 at the second heat spreader attachment location 714, the heat spreader 700 spans the hinge 101. In one or more embodiments, the first heat spreader attachment location 713 is separated from the first juncture 709 by a first distance 715. Similarly, the second heat spreader attachment location 714 is separated from the second juncture 710 by a second distance 716. The first distance 715 and the second distance 716 can be the same distances or different distances. In the illustrative embodiment of FIG. 7, the first distance 715 and the second distance 716 are the same.

To attach the heat spreader 700 to the electronic device 100 from the view shown in FIG. 7, the heat spreader is first inverted so that the thermally conductive adhesive 711,712 is oriented toward the first support surface 707 of the first device housing 102 and the second support surface 708 of the second device housing 103. The thermally conductive adhesive 711 is then attached to the first support surface 707 of the first device housing 102 at the first heat spreader attachment location 713. The thermally conductive adhesive 712 is then mechanically attached to the second support surface 708 of the second device housing 103 at the second heat spreader attachment location 714 such that the heat spreader 700 spans the hinge 101. This assembled view is shown in FIG. 8.

Figure 8:
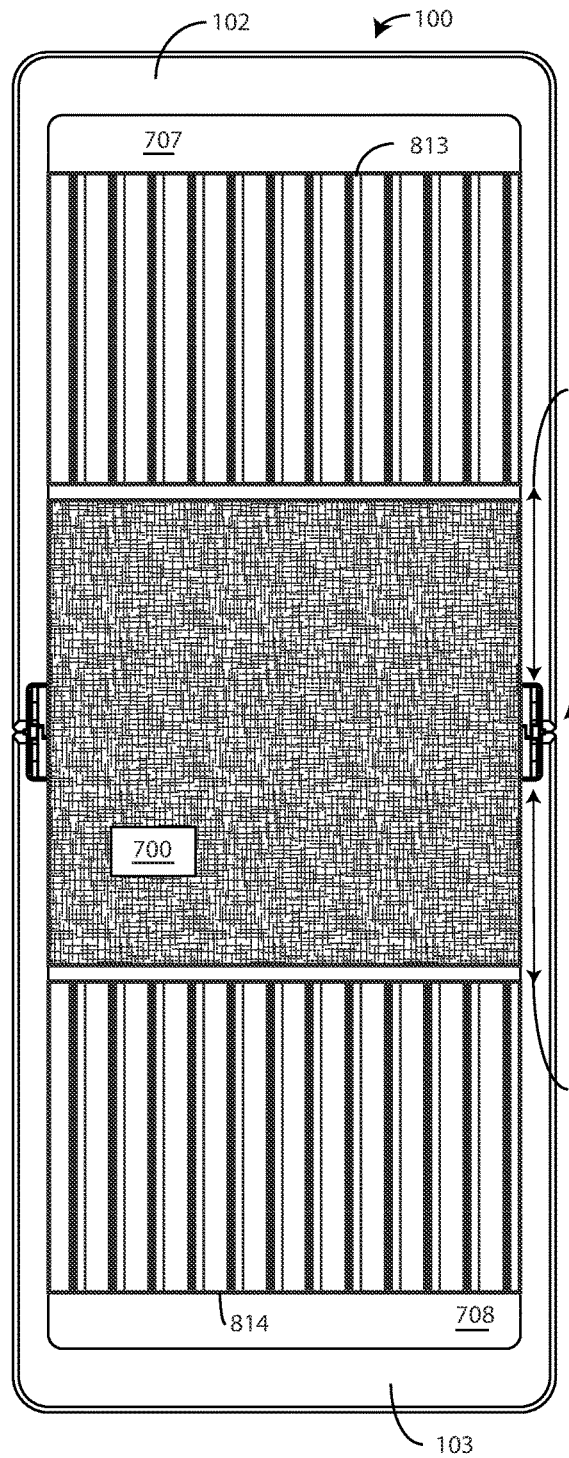
FIG. 8 illustrates a plan view of one explanatory electronic device with a heat spreader attached thereto in accordance with embodiments of the disclosure, and with the flexible display removed so that the heat spreader is visible.

Turning now to FIG. 8, the heat spreader 700 has been mechanically attached to the first support surface 707 of the first device housing 102 at the first heat spreader attachment location (713) and mechanically attached to the second support surface 708 of the second device housing 103 at the second heat spreader attachment location (714). As will be explained in more detail below with reference to FIG. 10, in one or more embodiments the heat spreader 700 is positioned between the flexible display (120) and the hinge 101. Testing has shown that additional bending cycles for the first device housing (102) can be achieved when the flexible display (120) is attached to the first support surface 707 of the first device housing 102 and to the second support surface 708 of the second device housing 103 locations that are farther from the locations at which the heat spreader 700 is attached to the first support surface 707 of the first device housing 102 and to the second support surface 708 of the second device housing 103. Said differently, testing has shown that additional bending of the first device housing (102) can occur without performance degradation when the flexible display (120) is mechanically attached to the first support surface 707 of the first device housing 102 at the first display attachment location 813 that is farther from the first juncture (709) than the heat spreader attachment location (713) and is mechanically attached to the second support surface 708 of the second device housing 103 at a second display attachment location 814 that is farther from the second juncture (710) than the second heat spreader attachment location (714). Testing has shown that situating the heat spreader 700 beneath the flexible display (120) and attaching each as described above advantageously can increase the average bending cycle life of the flexible display (120) before degradation occurs from approximately 30,000 cycles to on the order of 200,000 cycles.

Accordingly, shown in FIG. 8 is a first display attachment location 813 that is situated on the first support surface 707 a third distance 815 from the first juncture (709). Similarly, the second display attachment location 814 is situated on the second support surface 708 a fourth distance 816 from the second juncture (710). The third distance 815 and the fourth distance 816 can be the same or different. In the illustrative embodiment of FIG. 8, the third distance 815 and the fourth distance 816 are the same.

In one or more embodiments, the third distance 815 that the first display attachment location 813 is situated from the first juncture (709) is greater than the first distance (715) that the first heat spreader attachment location (713) is situated from the first juncture (709). Similarly, in one or more embodiments the fourth distance 816 that the second display attachment location 814 is situated from the second juncture (710) is greater than the second distance (716) that the second heat spreader attachment location (714) is situated from the second juncture (710). As will be described below with reference to FIG. 10, In one or more embodiments this allows at least a portion of the flexible display (120) to separate from the first support surface 707 within the third distance 815 when the first device housing 102 pivots relative to the second device housing 103 about the hinge 101 to the closed position (200), thereby causing the flexible display (120) and heat spreader 700 to define a service loop within an amalgamate chamber defined by the first chamber (701) and the second chamber (702). Similarly, at least another portion of the flexible display (120) can separate from the second support surface 708 within the fourth distance 816 when the first device housing 102 pivots relative to the second device housing 103 about the hinge 101 to the closed position (200).

In other embodiments, one example of which will be described below with reference to FIGS. 12-14, the third distance 815 that the first display attachment location 813 is situated from the first juncture (709) is equal to the first distance (715) that the first heat spreader attachment location (713) is situated from the first juncture (709). Similarly, in other embodiments the fourth distance 816 that the second display attachment location 814 is situated from the second juncture (710) is equal to the second distance (716) that the second heat spreader attachment location (714) is situated from the second juncture (710).

Figure 9:
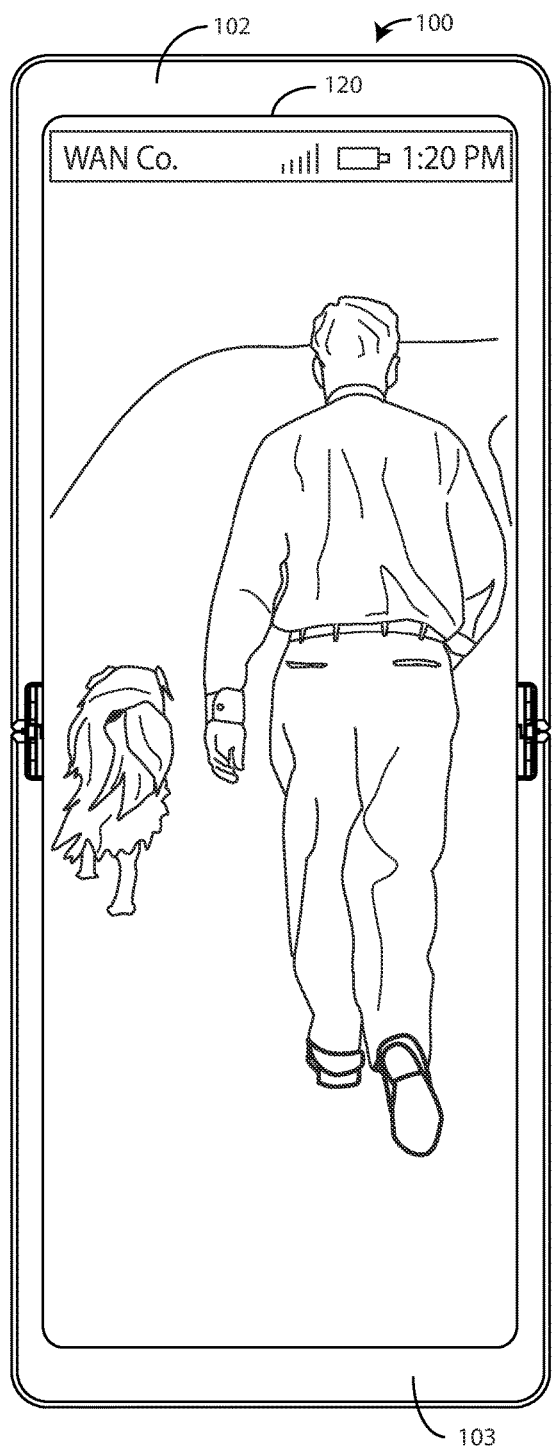
FIG. 9 illustrates a plan view of one explanatory electronic device in accordance with embodiments of the disclosure.

Turning now to FIG. 9, the electronic device 100 is shown again with the flexible display 120 attached to the first device housing 102 and the second device housing 103 such that the flexible display 120 spans the hinge 101. In this illustrative embodiment, the flexible display 120 has been placed atop the heat spreader (700) such that the heat spreader (700) is positioned between the flexible display 120 and the first support surface (707) of the first device housing 102 and the second support surface (708) of the second device housing 103.

In one or more embodiments, the flexible display 120 is attached to the first support surface (707) of the first device housing 102 and the second support surface (708) of the second device housing 103 by an adhesive. In one or more embodiments, the adhesive can be a different adhesive than the thermally conductive adhesive (711,712) used to attach the heat spreader (700) to the first support surface (707) of the first device housing 102 and the second support surface (708) of the second device housing 103. Illustrating by example, in one or more embodiments the adhesive used to attach the flexible display 120 to the first support surface (707) of the first device housing 102 and the second support surface (708) of the second device housing 103 has a lower modulus than does the thermally conductive adhesive (711, 712) used to attach the heat spreader (700) to the first support surface (707) of the first device housing 102 and the second support surface (708) of the second device housing 103. In other embodiments, the thermally conductive adhesive (711,712) used to attach the heat spreader (700) to the first support surface (707) of the first device housing 102 and the second support surface (708) of the second device housing 103 can be the same as the adhesive used to attach the flexible display 120 to the first support surface (707) of the first device housing 102 and the second support surface (708) of the second device housing 103.

To attach the flexible display 120 to the electronic device 100, the adhesive is attached to the first support surface (707) of the first device housing 102 at the first display attachment location (813). The adhesive is then mechanically attached to the second support surface (708) of the second device housing 103 at the second display attachment location (814) such that the flexible display 120 spans the hinge 101. This results in the flexible display 120 being mechanically attached to the first support surface (707) a third distance (815) from the first juncture (709) and mechanically attached to the second support surface (708) a fourth distance (816) from the second juncture (710), as shown in FIG. 9.

Figure 10:
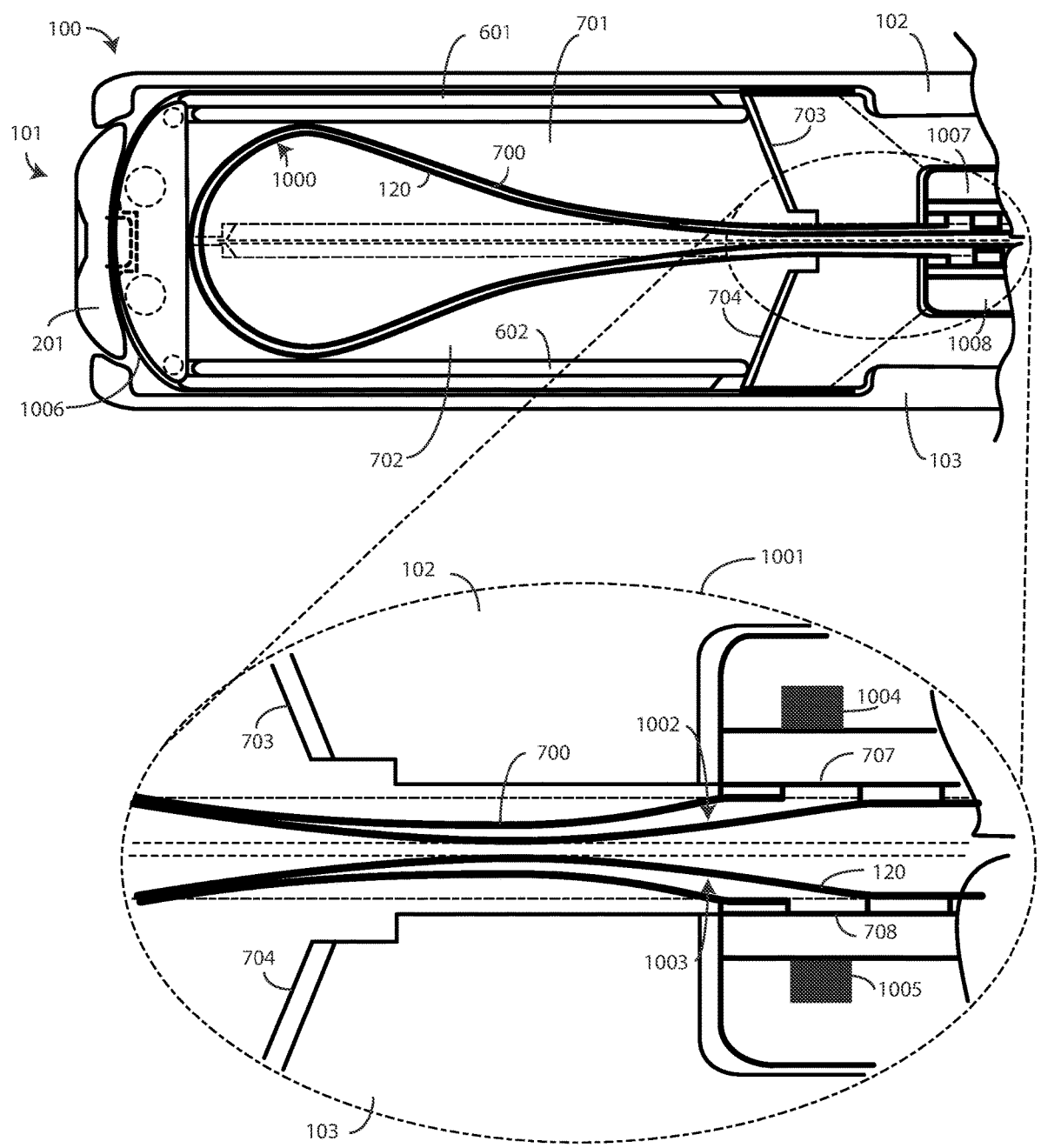
FIG. 10 illustrates a sectional view of one explanatory electronic device in accordance with one or more embodiments of the disclosure, with the electronic device in a closed position.

Turning now to FIG. 10, illustrated therein is a cut away view of the electronic device 100. In this illustration, the flexible display 120 is positioned within the linear recesses (605,606) of the first device housing 102 and the second device housing 103, respectively. As shown, the first device housing 102 defines the first chamber 701, while the second device housing 103 defines the second chamber 702.

As shown in FIG. 10, the first device housing 102 and the second device housing 103 have been pivoted about the hinge 101 to the closed position. In one or more embodiments, when this occurs, a distal end of each of the first support plate 601 and the second support plate 602 travels along its respective inclined plane 703,704 between a first position (shown in FIG. 11) within the first device housing 102 and the second device housing 103, respectively, to a second position (shown in FIG. 10) within the first device housing 102 and the second device housing 103, respectively.

Figure 11:
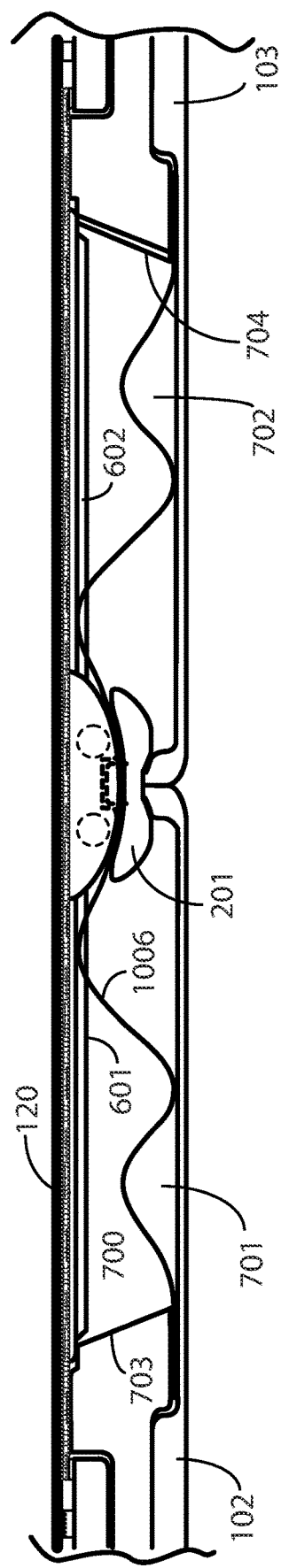
FIG. 11 illustrates a sectional view of one explanatory electronic device in accordance with one or more embodiments of the disclosure, with the electronic device in an axially displaced open position.

The distal ends of each of the first support plate 601 and the second support plate 602 therefore travel, in one or more embodiments, along their respective inclined planes 703,704 through the first chamber 701 and the second chamber 702 between the first position of FIG. 11 within the first device housing 102 and the second device housing 103, respectively, to the second position of FIG. 10 within the first device housing 102 and the second device housing 103, respectively, when the first device housing 102 and the second device housing 103 pivot about the hinge 101 from an axially displaced open position of FIG. 11 to the closed position of FIG. 10. When this occurs, the first support plate 601, the hinge housing 201, and the second support plate 602 define boundaries within which the heat spreader 700 and the flexible display 120 can each define a service loop 1000 in the amalgamate chamber defined by the first chamber 701 and the second chamber 702. The area opened for the service loop 1000 by the translation of the first support plate 601 and the second support plate 602, in one embodiment, has a radius of at least five millimeters. Such a radius prevents the flexible display 120 from kinking or folding. It also works to minimize mechanical memory problems when the first device housing 102 and the second device housing 103 pivot about the hinge 101 to the open position of FIG. 11.

As previously described above with reference to FIGS. 7-9, in one or more embodiments the heat spreader 700 and the flexible display 120 are coupled to the first device housing 102 and the second device housing 103, respectively, at different locations. As shown in the enlarged view 1001 of FIG. 10, in this illustrative embodiment the heat spreader 700 is attached to the first device housing 102 and the second device housing 103 at locations closer to the hinge 101 than other locations where the flexible display 120 is coupled to the first device housing 102 and the second device housing 103. From the separation shown in both the regular view of FIG. 10 and in the enlarged view 1001 of FIG. 10 it can be seen that in this illustrative embodiment the portions of the heat spreader 700 spanning the hinge 101 are unattached from portions of the flexible display 120 that span the hinge 101. As shown in the enlarged view 1001 of FIG. 10, this causes at least a portion 1002 of the flexible display 120 to separate from the first support surface 707 within the distance between the first juncture 709 and the attachment location at which the flexible display 120 is mechanically attached to the first support surface 707. Similarly, at least another portion 1003 of the flexible display 120 separates from the second support surface 708 within the distance between the second juncture 710 and the attachment location at which the flexible display 120 is mechanically attached to the second support surface 708. In one or more embodiments, this separation is caused when the first device housing 102 pivots about the hinge 101 relative to the second device housing 103 from the axially displaced open position of FIG. 11 to the closed position of FIG. 10.

In one or more embodiments, heat generating electronics 1004,1005 are situated within one or both of the first device housing 102 or the second device housing 103. The heat generating electronics 1004,1005 can include elements from the block diagram schematic (110) of FIG. 1, or other electronic components. In one or more embodiments, the heat generating electronics 1004,1005 are thermally coupled to one or both of the first device housing 102 or the second device housing 103. In the illustrative embodiment of FIG. 10, the heat generating electronics 1004 situated within the first device housing 102 are thermally coupled to the first device housing 102, while the heat generating electronics 1005 situated within the second device housing 103 are thermally coupled to the second device housing 103. By coupling the heat spreader 700 to the first device housing 102 and the second device housing 103 with the thermally conductive adhesive, the heat spreader 700 thermally transfers heat from the heat generating electronics 1004,1005 across the hinge 101.

Also shown in FIG. 10 is the flexible substrate 1006. In one or more embodiments, the flexible substrate 1006 provides a reliable electrical link through the hinge 101 between a first electronic circuit 1007 disposed in the first device housing 102 and a second electronic circuit 1008 disposed in the second device housing 103. Each of the first electronic circuit 1007 and the second electronic circuit 1008 can be configured as one or more electrical components, e.g., resistors, capacitors, inductors, integrated circuit chips, and so forth, coupled to a printed circuit board so as to form a printed circuit board assembly. In one or more embodiments, the first electronic circuit 1007 includes at least some heat generating electronics 1004, while the second electronic circuit 1008 includes at least some heat generating electronics 1005 as well.

The first electronic circuit 1007 can include a first circuit board, while the second electronic circuit 1008 can include a second circuit board, and so forth. In one embodiment, each of the first circuit board and the second circuit board can be manufactured from multiple layers. Some layers can be selectively placed conductive metal, such as copper or aluminum, while other layers can be insulative. Insulative layers can be manufactured from fiberglass, FR4, or other materials. In one or more embodiments, each of the first circuit board and the second circuit board comprises a fiberglass printed circuit board. In another embodiment, each of the first circuit board and the second circuit board is a FR4 printed circuit board.

In the illustrative embodiment of FIG. 8, the flexible substrate 1006 passes through the first chamber 701 and the second chamber 702, and further spans the hinge 101, to electrically connect the first electronic circuit 1007 to the second electronic circuit 1008. (In one or more embodiments, the heat spreader 700 is electrically isolated from the first electronic circuit 1007 to the second electronic circuit 1008.)

In this illustrative embodiment, the flexible substrate 1006 spans the hinge 101 by passing between a first portion of the hinge housing 201 and a second portion of the hinge housing 201. Power (voltage and current), digital signals, analog signals, common nodes (e.g., ground or Vcc), and other electrical connections can be made by electrically coupling the flexible substrate 1006 to both the first electronic circuit 1007 and the second electronic circuit 1008.

In one embodiment, the flexible substrate 1006 comprises flexible copper conductors encapsulated in a flexible insulative material. One example of such an insulative material is Kapton.sup.TM manufactured by DuPont. The flexible substrate 1006, in addition to having flexible conductors running within the substrate, may also have conductive pads and traces atop the substrate for coupling to the printed circuit boards or other electrical connections of the first electronic circuit 1007 and the second electronic circuit 1008, respectively.

In one or more embodiments, when the first device housing 102 and the second device housing 103 pivot about the hinge 101 from an axially displaced open position to the closed position of FIG. 10, this mechanical operation applies forces to the flexible substrate 1006. In the illustrative embodiment of FIG. 10, the flexible substrate 1006 includes, and extends between, a first end and a second end. In one or more embodiments, the first end is fixedly coupled at a first location within the first device housing 102. Similarly, the second end is fixedly coupled at a second location within the second device housing 103.

With the first end and the second end fixed at the first location and the second location, respectively, when the first device housing 102 pivots about the hinge 101 relative to the second device housing 103 to the closed position, this causes the first location to separate from the second location as the distance is measured through the path taken by the flexible substrate 1006. In this illustrative embodiment, the movement of the first location away from the second location, and thus the first end away from the second end, causes the flexible substrate 1006 to remove deformations from a deformed state between the first location and the second location. Said differently, the flexible substrate 1006 is becomes less slack about the hinge 101 when the first device housing 102 and the second device housing 103 are pivoted about the hinge 101 to the closed position in this illustrative embodiment.

Turning now to FIG. 11, the first device housing 102 and the second device housing 103 have been rotated about the hinge 101 to the axially displaced open position. When this occurs, due to the action of the hinge housing 201, the distal ends of the first support plate 601 and the second support plate 602 translate up their respective inclined planes 703, 704, through the first chamber 701 and the second chamber 702, from the second position of FIG. 10 to the first position shown in FIG. 11. In the illustrative embodiment of FIG. 11, when the distal ends of the first support plate 601 and the second support plate 602 fully translate up their respective inclined planes 703,704 from the second position of FIG. 10 to the first position shown in FIG. 11, they sit atop ends of the inclined planes 703,704 situated at the first juncture 709 and the second juncture 710.

In this position, the first support plate 601, the hinge housing 201, and the second support plate 602 bridge the linear recess 605 of the first device housing 102 and the linear recess 606 of the second device housing 103 when the first device housing 102 and the second device housing 103 are in an axially displaced open position shown in FIG. 11. In one or more embodiments, this mechanical operation applies forces to the flexible display 120, the heat spreader 700, and the flexible substrate 1006. The heat spreader 700 and flexible display 120 get elongated, while the flexible substrate 1006 deforms to a deformed state as shown in FIG. 11. The first support plate 601, the second support plate 602, and the hinge housing 201 work in tandem to mechanically support both the heat spreader 700 and the flexible display 120.

Moreover, translation of the first support plate 601 and the second support plate 602 to the first position shown in FIG. 11 creates a dynamic region in the first chamber 701 and another dynamic region in the second chamber 702 within which the flexible substrate 1006 can deform. As shown in FIG. 11, in one or more embodiments the flexible substrate 1006 defines a curvilinear shape in one or both of the first dynamic region of the first chamber 701 and/or the second dynamic region of the second chamber 702 when the first device housing 102 and the second device housing 103 are pivoted about the hinge 101 to the axially displaced open position.

In this illustrative embodiment, the curvilinear shape defines at least a partially oscillating shape that defines at least one apex and at least one nadir 8. In the illustrative embodiment of FIG. 11, the at least partially oscillating shape is a dampened curvilinear wave, with apexes farther from the hinge 101 having lower amplitudes than apexes near the hinge 101.

Figure 12:
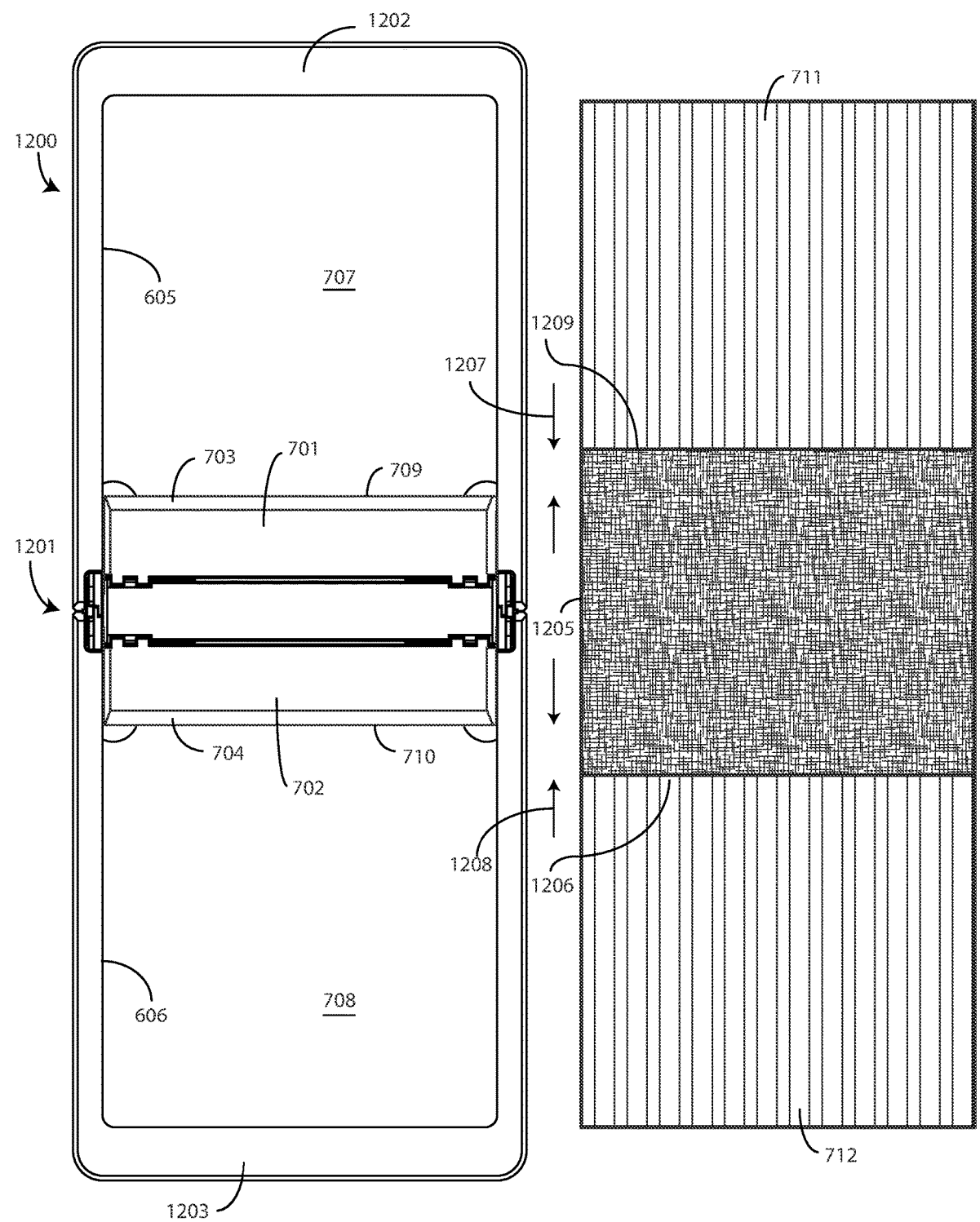
FIG. 12 illustrates a plan view of one explanatory electronic device with an alternate heat spreader in accordance with embodiments of the disclosure.

Turning now to FIG. 12, illustrated therein is another electronic device 1200 configured in accordance with one or more embodiments of the disclosure. As with the electronic device (100) of FIG. 7, the electronic device 1200 is shown with the first support plate (601) and the second support plate (602) removed so that additional details of the first device housing 1202 and the second device housing 1203 can more readily be seen.

In one or more embodiments, each of the first device housing 1202 and the second device housing 1203 define a first chamber 701 and a second chamber 702, respectively. The hinge housing 201 then separates the first chamber 701 defined by the first device housing 1202 from the second chamber 702 defined by the second device housing 1203.

In one or more embodiments, each of the first chamber 701 and the second chamber 702 comprises an inclined plane 703,704. In this illustrative embodiment, the first device housing 1202 and the second device housing 1203 each define linear recesses 605,606 into which a flexible display (120) may be positioned. In one or more embodiments, the linear recesses 605,606 bound support surfaces 707,708 against which the flexible display (120) may be positioned and/or to which the flexible display (120) may be mechanically attached.

As before, the first support surface 707 joins the first chamber 701 defined by the first device housing 1202 at a first juncture 709. Similarly, the second support surface 708 joins the second chamber 702 defined by the second device housing 1203 at a second juncture 710.

Shown to the side of the electronic device 1200 in FIG. 12 is another heat spreader 1205. The heat spreader 1205 is again a thermal conduit configured to transfer heat from one of the first device housing 1202 or the second device housing 1203 to another of the first device housing 1202 or the second device housing 103. In one or more embodiments, the heat spreader 1205 is manufactured from a flexible thermally conductive material. Illustrating by example, in one or more embodiments the heat spreader 1205 is manufactured from a flexible graphite film.

In one or more embodiments, a first side of the heat spreader 1205 is mechanically attached to the first support surface 707 of the first device housing 1202 by a thermally conductive adhesive 711. Similarly, a second side of the heat spreader 1205 can be mechanically attached to the second support surface 708 of the second device housing 103 by a thermally conductive adhesive 712.

In this illustrative embodiment, the heat spreader 1205 spans the bounds of the linear recesses 605,606 into which the flexible display (120) may be positioned, which makes the heat spreader 1205 coextensive with the flexible display (120). The heat spreader 1205 is mechanically attached to the first support surface 707 of the first device housing 1202 at a location 1209 situated a first distance 1207 from the first juncture 709. Similarly, the heat spreader 1205 is mechanically attached to the second support surface 708 of the second device housing 1203 at another location 1206 situated a second distance 1208 from the second juncture 710. The first distance 1207 and the second distance 1208 can be the same distances or different distances. In the illustrative embodiment of FIG. 12, the first distance 1207 and the second distance 1208 are the same. When the first side of the heat spreader 1205 is mechanically attached to the first support surface 707 of the first device housing 1202 at the first location 1209 and the second side of the heat spreader 1205 is mechanically attached to the second support surface 708 of the second device housing 1203 at the second location 1206, the heat spreader 1205 spans the hinge 1201.

Figure 13:
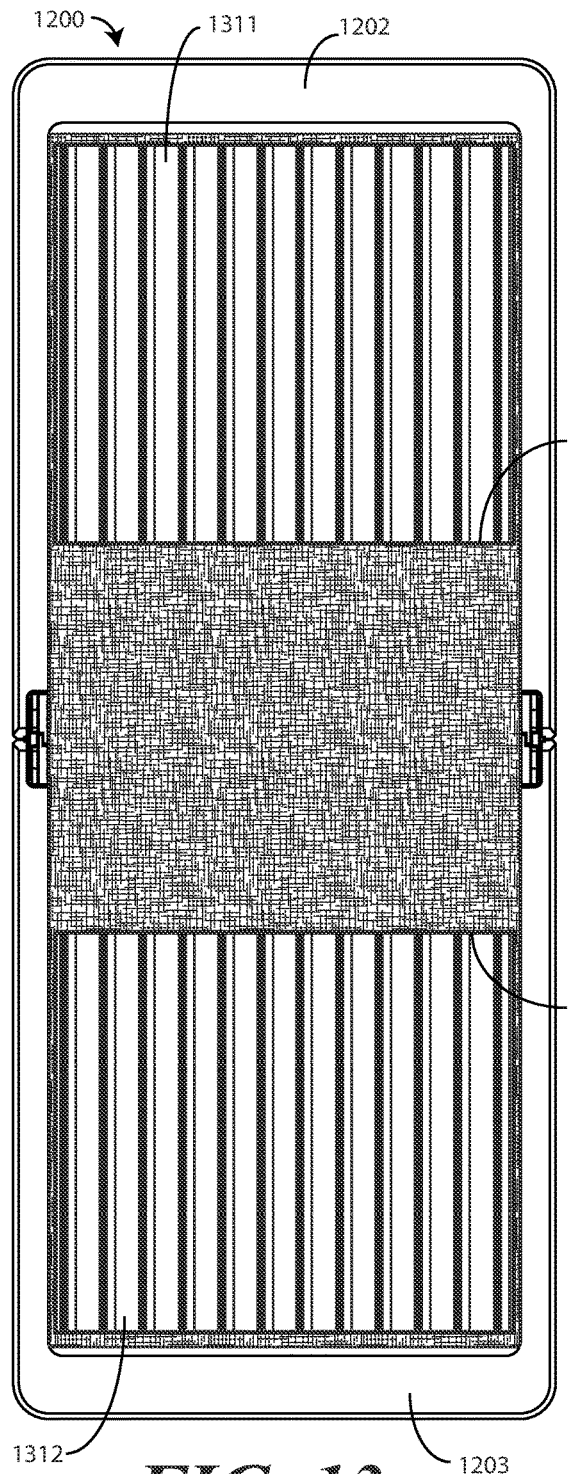
FIG. 13 illustrates a plan view of one explanatory electronic device with an alternate heat spreader attached thereto in accordance with embodiments of the disclosure, and with the flexible display removed so that the heat spreader is visible.

Turning now to FIG. 13, the heat spreader 1205 has been mechanically attached to the first support surface (707) of the first device housing 1202 at the first location 1209 and mechanically attached to the second support surface (708) of the second device housing 1203 at the second location 1206. In this illustrative embodiment, rather than having the flexible display (120) attached to the first support surface (707) of the first device housing 1202 and to the second support surface (708) of the second device housing 1203 locations that are farther from the locations 1209,1206 at which the heat spreader 1205 is attached to the first support surface (707) of the first device housing 1202 and to the second support surface (708) of the second device housing 1203, the flexible display (120) is attached to the heat spreader 1205 at the same locations 1209,1206 that the heat spreader 1205 is attached to the first support surface (707) of the first device housing 1202 and to the second support surface (708) of the second device housing 1203.

In this illustrative embodiment, adhesive 1311,1312 has been applied to the heat spreader 1205 at locations that are coextensive with the locations (on the other side of the heat spreader 1205) where the thermally conductive adhesive (711,712) is attached to the heat spreader 1205. This results in the flexible display (120) being attached to the heat spreader 1205 at the same locations 1209,1206 that the heat spreader 1205 is attached to the first support surface (707) of the first device housing 1202 and to the second support surface (708) of the second device housing 1203. While the adhesive 1311,1312 is coextensive with the thermally conductive adhesive (711,712) (on opposite sides of the heat spreader 1205) in this illustrative embodiments, in other embodiments the adhesive 1311,1312 will occupy more, or less, surface area of the heat spreader 1205 than does the thermally conductive adhesive (711,712).

Regardless of how much adhesive 1311,1312 or thermally conductive adhesive (711,712) is used, in one or more embodiments the flexible display (120) is mechanically attached to the heat spreader 1205 at locations 1209,1206 that are the same distance as that at which the heat spreader 1205 is attached to the first device housing 1202 and second device housing 1203. Thus, in one or more embodiments the distance from the first juncture (709) and second juncture (710) that flexible display (120) is attached to the heat spreader 1205 is the same as the distance from the first juncture (709) and second juncture (710) that the heat spreader 1205 is attached to the first device housing 1202 and the second device housing 1203.

Figure 14:
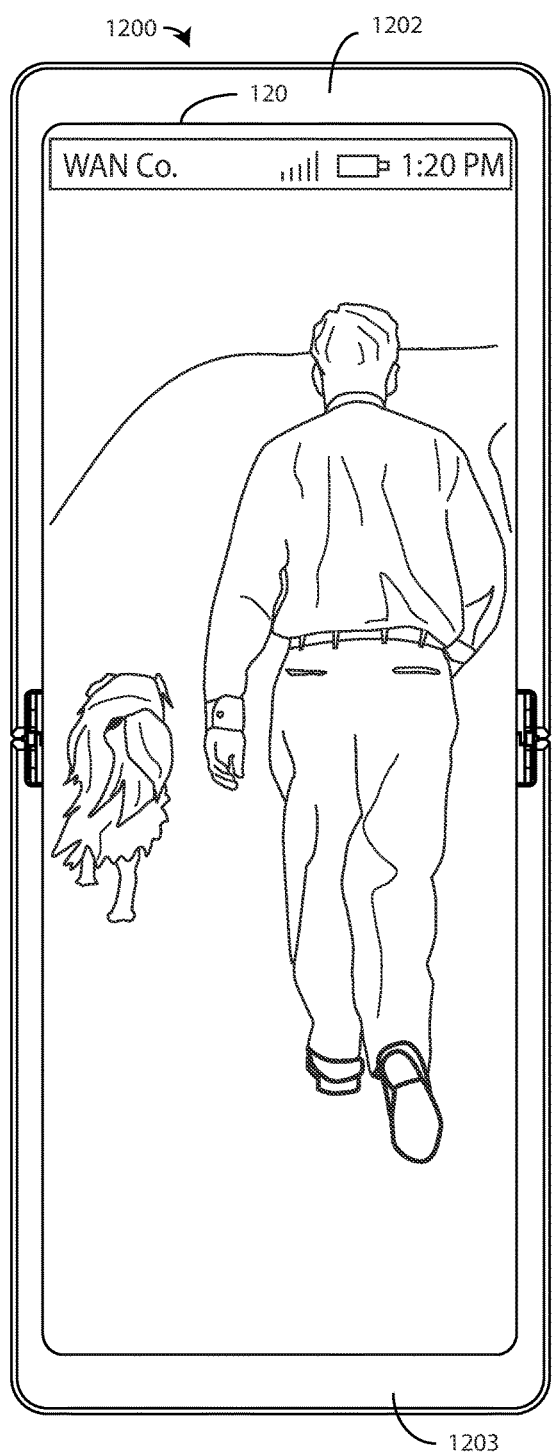
FIG. 14 illustrates a plan view of one explanatory electronic device in accordance with embodiments of the disclosure.

Turning now to FIG. 14, the electronic device 1200 is shown with the flexible display 120 attached to the first device housing 1202 and the second device housing 1203 such that the flexible display 120 spans the hinge 1201. In this illustrative embodiment, the flexible display 120 has been placed atop the heat spreader (1205) such that the heat spreader (1205) is positioned between the flexible display 120 and the first support surface (707) of the first device housing 1202 and the second support surface (708) of the second device housing 1203.

Figure 15:
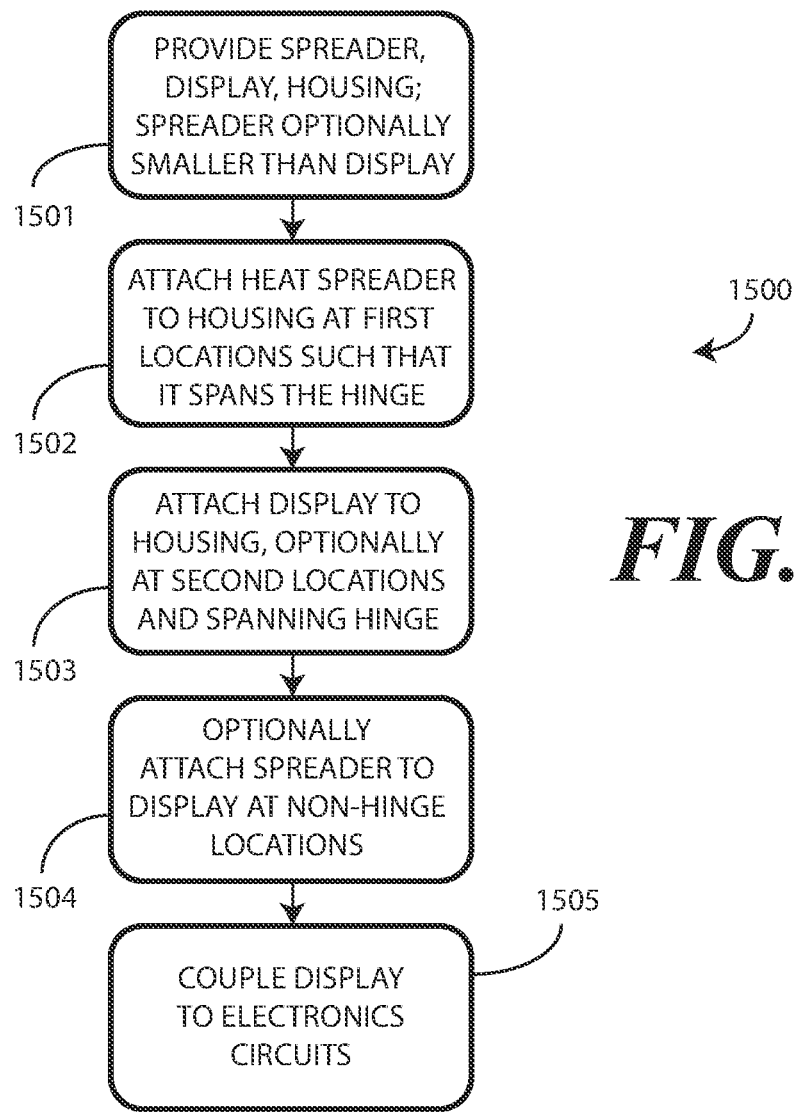
FIG. 15 illustrates one explanatory method of assembling an electronic device in accordance with one or more embodiments of the disclosure.

Turning now to FIG. 15, illustrated therein is one explanatory method 1500 for manufacturing an electronic device in accordance with one or more embodiments of the disclosure. Beginning at step 1501, an electronic device comprising a first device housing separated from a second device housing by a hinge such that the first device housing is pivotable relative to the second device housing about the hinge between an axially displaced open position and a closed position is provided. A flexible display is also provided at step 1501, as is a heat spreader. In one embodiment, the heat spreader is coextensive in area with the flexible display. In other embodiments, the heat spreader has less surface area along its major surfaces than does the flexible display.

At step 1502, the method 1500 includes mechanically attaching a heat spreader to a first support surface of the first device housing at a first location separated from an edge of the first support surface by a first distance. Step 1502 further comprises mechanically attaching the heat spreader to a second support surface of the second device housing at second location separated from an edge of the second support surface by a second distance. In one or more embodiments, the heat spreader is coupled to the first device housing and the second device housing by a thermally conductive adhesive.

Step 1503 then comprises positioning a flexible display atop the heat spreader and mechanically attaching the flexible display to the first support surface at a third location separated from the edge of the first support surface by a third distance. Step 1503 also comprises mechanically attaching the flexible display to the second support surface at a fourth location separated from the edge of the second support surface by a fourth distance.

In one or more embodiments, the third distance is greater than the first distance, and the fourth distance is greater than the second distance. One example of this is described above with reference to FIGS. 7-9. In other embodiments, the third distance is substantially equal to the first distance, while the fourth distance is substantially equal to the second distance. One example of this is described above with reference to FIGS. 12-14.

Optional step 1504, which can be included in situations such as when the heat spreader is coextensive with the flexible display, comprises attaching the flexible display to the heat spreader to facilitate the attachment of step 1503. One example of this is described above with reference to FIGS. 12-14. In one or more embodiments, this attachment of the flexible display to the heat spreader occurs only at locations other than where the flexible display and heat spreader span the hinge. This results in portions of the heat spreader spanning the hinge being unattached from portions of the flexible display spanning the hinge. At step 1505, the flexible display can be coupled to the electronics carried by the first device housing and/or second device housing, thereby completing the assembly.

Figure 16:
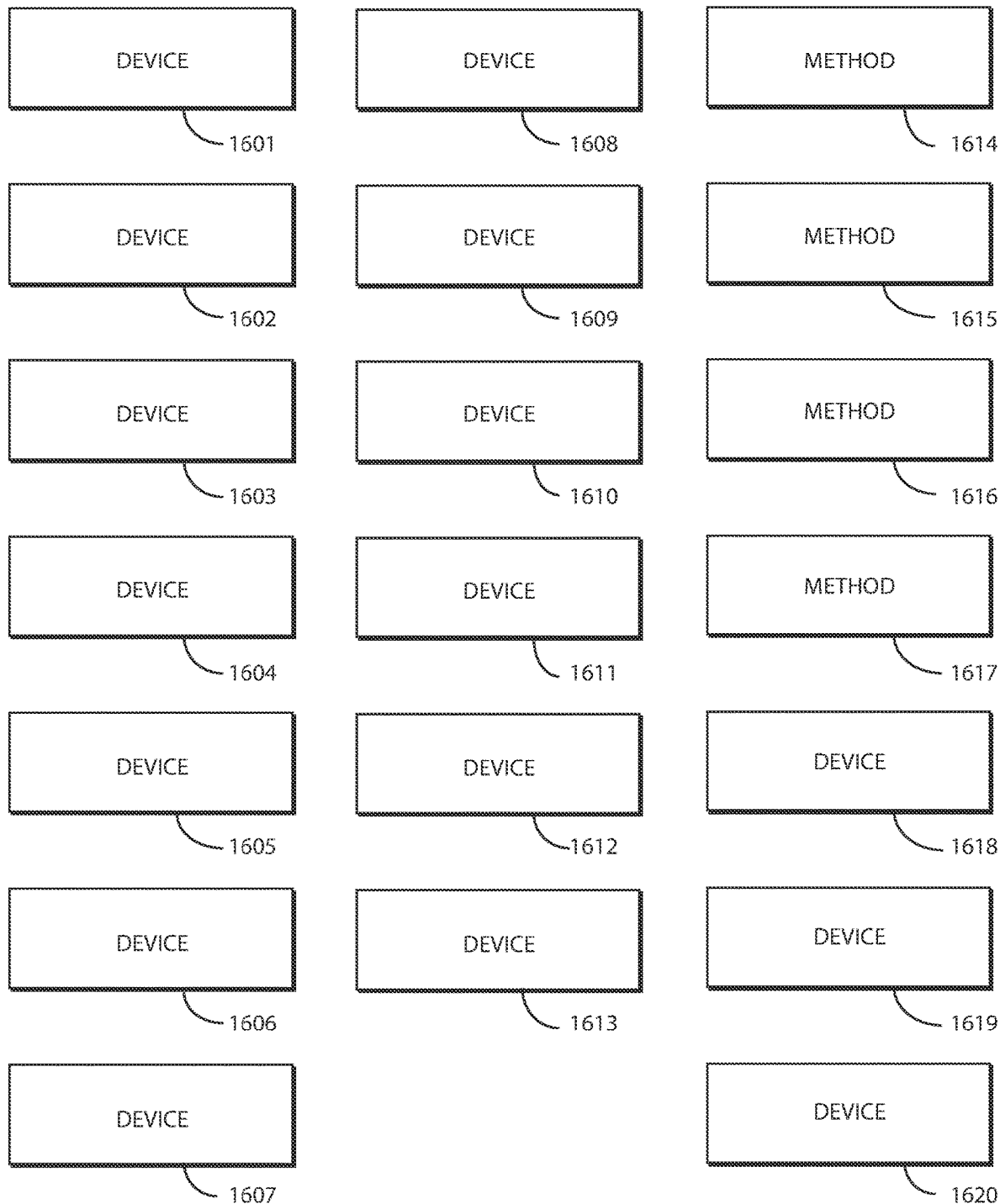
FIG. 16 illustrates various embodiments of the disclosure.

Turning now to FIG. 16, illustrated therein are various embodiments of the disclosure. The embodiments of FIG. 16 are shown as labeled boxes in FIG. 16 due to the fact that the individual components of these embodiments have been illustrated in detail in FIGS. 1-15, which precede FIG. 16. Accordingly, since these items have previously been illustrated and described, their repeated illustration is no longer essential for a proper understanding of these embodiments. Thus, the embodiments are shown as labeled boxes.

Beginning at 1601, an electronic device comprises a first device housing coupled to a second device housing by a hinge. At 1601, the first device housing is pivotable about the hinge relative to the second device housing between a closed position and an axially displaced open position. At 1601, the first device housing defines a first chamber adjoining a first support surface at a first juncture, while the second device housing defining a second chamber adjoining a second support surface at a second juncture.

At 1601, the electronic device comprises a flexible display spanning the hinge. At 1601, the flexible display is mechanically attached to the first support surface a first distance from the first juncture and mechanically attached to the second support surface a second distance from the second juncture.

At 1602, the electronic device of 1601 further comprises a heat spreader spanning the hinge. At 1602, the heat spreader is mechanically attached to the first support surface a third distance from the first juncture and mechanically attached to the second support surface a fourth distance from the second juncture. At 1603, the heat spreader of 1602 is positioned between the flexible display and the hinge.

At 1604, the flexible display and the heat spreader of 1603 each define a service loop within a amalgamate chamber defined by the first chamber and the second chamber when the first device housing and the second device housing pivot to the closed position.

At 1605, at least a portion of the flexible display of 1604 separates from the first support surface within the first distance from the first juncture when the first device housing and the second device housing pivot to the closed position. At 1605, at least another portion of the flexible display separates from the second support surface within the second distance from the second juncture when the first device housing and the second device housing pivot to the closed position.

1606, the first distance of 1602 is substantially equivalent to the second distance. At 1607, the third distance of 1602 is less than the first distance and the fourth distance is less than the second distance.

At 1608, the heat spreader of 1602 is coextensive with the flexible display. At 1608, the heat spreader is mechanically attached to the first device housing at a location situated the third distance from the first juncture and at another location situated the fourth distance from the second juncture.

At 1609, the heat spreader is manufactured from a thermally conductive material. At 1610, the heat spreader of 1609 comprises a carbon-based film. At 1611, the heat spreader of 1610 is attached to the first support surface and the second support surface by a thermally conductive adhesive.

At 1612, the electronic device of 1602 further comprises heat generating electronics in one or both of the first device housing or the second device housing. At 1613, the heat generating electronics of 1612 are thermally coupled to the one or both of the first device housing or the second device housing. At 1613, the heat spreader thermally transfers heat from the heat generating electronics across the hinge.

At 1614, a method of manufacturing an electronic device comprises mechanically attaching a heat spreader to a first support surface of a first device housing pivotally coupled to a second device housing by a hinge at a first location separated from an edge of the first support surface by a first distance. At 1614, the method comprises mechanically attaching the heat spreader to a second support surface of the second device housing at second location separated from an edge of the second support surface by a second distance.

At 1614, the method comprises positioning a flexible display atop the heat spreader. At 1614, the method comprises mechanically attaching the flexible display to the first support surface at a third location separated from the edge of the first support surface by a third distance. At 1614, the method comprises mechanically attaching the flexible display to the second support surface at a fourth location separated from the edge of the second support surface by a fourth distance.

At 1615, one or both of the first device housing or the second device housing of 1614 is manufactured from a thermally conductive material. At 1616, the thermally conductive material of 1615 is aluminum. At 1617, the method of 1614 further comprises causing at least a portion of the flexible display to separate from the first support surface and at least another portion of the flexible display to separate from the second support surface by pivoting the first device housing about the hinge relative to the second device housing from an axially displaced open position to a closed position.

At 1618, an electronic device comprises a first device housing coupled to a second device housing by a hinge. At 1618, the electronic device comprises a heat spreader coupled to the first device housing and the second device housing and spanning the hinge. At 1618, the electronic device comprises a flexible display coupled to the first device housing and the second device housing and spanning the hinge. At 1618, the heat spreader and the flexible display are coupled to the first device housing and the second device housing, respectively, at different locations.

At 1619, the heat spreader of 1618 is attached to the first device housing and second device housing at locations closer to the hinge than other locations where the flexible display is coupled to the first device housing and the second device housing. At 1620, the portions of the heat spreader of 1619 spanning the hinge are unattached from portions of the flexible display spanning the hinge.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Figure 17:
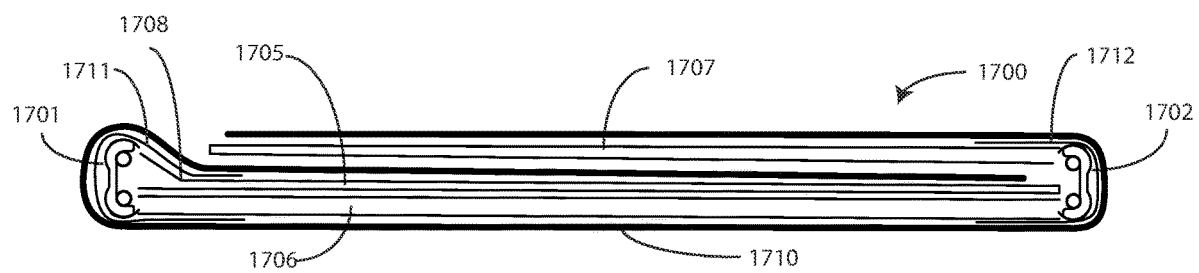
FIG. 17 illustrates an alternate electronic device in accordance with one or more embodiments of the disclosure.

For example, while flexible displays described above in illustrative embodiments have generally spanned the interior of device housings to this point, embodiments of the disclosure contemplate that they could span the exterior as well. Turning now to FIG. 17, illustrated therein is one such embodiment.

As shown in FIG. 17, an electronic device 1700 includes a plurality of hinges 1701,1702 and a plurality of device housings 1705, 1706, 1707. A first hinge 1701 couples a first device housing 1705 to a second device housing 1706. A flexible display 1710 extends across the first device housing 1705 and spans the hinge 1701 about an exterior of the electronic device 1700.

However, rather than the second device housing 1706 terminating at an edge, it terminates instead at a second hinge 1702. The flexible display 1710 extends across an exterior of the second device housing 1706. The flexible display then and spans the second hinge 1702 about the exterior of the electronic device 1700, terminating at a location on the third device housing 1707.

To facilitate the flexible display 1710 extending flat when the electronic device 1700 is unfolded, a third hinge could be included at location 1708. This third hinge would rotate in the opposite direction to hinge 1701, much in the same way a watchband made from coupled links can rotate. This would transition location 1708 from an acute angle to flat. Support plates, as previously described, could then work to extend the flexible display 1710 about the exterior of the electronic device 1700. Additionally, a mechanical stop could be placed between the third device housing 1707 and the first device housing 1705 to prevent pinching.

One or more heat spreaders 1711,1712 could be positioned between the device housings 1705, 1706, 1707 and the flexible display 1710 as previously described. In one or more embodiments, the flexible display 1710 could be coupled to the device housings 1705, 1706, 1707 farther than the hinges 1701,1702 than are the heat spreaders 1711,1712. In other embodiments, the flexible display 1710 could be coupled to the heat spreaders 1711,1712 at collocated locations from the hinges 1701,1702 as where the heat spreaders 1711,1712 are coupled to the device housings 1705, 1706, 1707. The heat spreaders 1711,1712 can be smaller than the flexible display 1710 as shown in FIG. 17. Alternatively, a single heat spreader that is coextensive with the flexible display 1710 could be substituted for the two heat spreaders 1711,1712 of FIG. 17. Other configurations will be obvious to those of ordinary skill in the art having the benefit of this disclosure.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a first device housing coupled to a second device housing by a hinge, the first device housing pivotable about the hinge relative to the second device housing between a closed position and an axially displaced open position, the first device housing defining a first chamber adjoining a first support surface at a first juncture, the second device housing defining a second chamber adjoining a second support surface at a second juncture;
   a flexible display spanning the hinge, the flexible display mechanically attached to the first support surface a first distance from the first juncture and mechanically attached to the second support surface a second distance from the second juncture; and
   a heat spreader spanning the hinge, the heat spreader mechanically attached to the first support surface a third distance from the first juncture and mechanically attached to the second support surface a fourth distance from the second juncture, wherein the heat spreader is positioned between the flexible display and the hinge;
   wherein at least a portion of the flexible display separates from the first support surface within the first distance from the first juncture and at least another portion of the flexible display separates from the second support surface within the second distance from the second juncture when the first device housing and the second device housing pivot to the closed position.

2. The electronic device of claim 1, wherein the third distance and the fourth distance are different distances.

3. The electronic device of claim 1, wherein a width of the heat spreader is maximized within the first device housing and the second device housing.

4. The electronic device of claim 3, wherein the flexible display and the heat spreader each define a service loop within an amalgamate chamber defined by the first chamber and the second chamber when the first device housing and the second device housing pivot to the closed position.

5. The electronic device of claim 4, wherein the service loop having a radius of at least five millimeters.

6. The electronic device of claim 1, wherein the first distance is substantially equivalent to the second distance.

7. The electronic device of claim 1, wherein the third distance is less than the first distance and the fourth distance is less than the second distance.

8. The electronic device of claim 1, wherein the heat spreader is coextensive with the flexible display and the heat spreader is mechanically attached to the first device housing at a location situated the third distance from the first juncture and at another location situated the fourth distance from the second juncture.

9. The electronic device of claim 1, wherein the heat spreader is manufactured from a thermally conductive material.

10. The electronic device of claim 9, wherein the heat spreader comprises a carbon-based film.

11. The electronic device of claim 10, wherein the heat spreader is attached to the first support surface and the second support surface by a thermally conductive adhesive.

12. The electronic device of claim 1, further comprising heat generating electronics in one or both of the first device housing or the second device housing.

13. The electronic device of claim 12, wherein the heat generating electronics are thermally coupled to the one or both of the first device housing or the second device housing, the heat spreader thermally transferring heat from the heat generating electronics across the hinge.

14. A method of manufacturing an electronic device, the method comprising:
   mechanically attaching a heat spreader to a first support surface of a first device housing, the first device housing defining a first chamber adjoining the first support surface at an edge of the first support surface and pivotally coupled to a second device housing by a hinge, the heat spreader attached to the first support surface at a first location separated from the edge of the first support surface by a first distance;
   mechanically attaching the heat spreader to a second support surface of the second device housing, the second device housing defining a second chamber adjoining an edge of the second support surface, the heat spreader attached to the second support surface at second location separated from the edge of the second support surface by a second distance;
   positioning a flexible display atop the heat spreader;
   mechanically attaching the flexible display to the first support surface at a third location separated from the edge of the first support surface by a third distance;

mechanically attaching the flexible display to the second support surface at a fourth location separated from the edge of the second support surface by a fourth distance; and causing at least a portion of the flexible display to separate from the first support surface within the first distance from the edge of the first support surface and at least another portion of the flexible display to separate from the second support surface within the second distance from the edge of the second support surface by pivoting the first device housing about the hinge relative to the second device housing from an axially displaced open position to a closed position.

15. The method of claim 14, wherein one or both of the first device housing or the second device housing is manufactured from a thermally conductive material.

16. The method of claim 15, wherein the thermally conductive material is aluminum.

17. The method of claim 14, wherein the heat spreader comprises graphite.

18. An electronic device, comprising:
a first device housing coupled to a second device housing by a hinge, the first device housing defining a first support surface having a first support surface edge intersecting a first inclined plane and a second support surface having a second support surface edge intersecting a second inclined plane;
a heat spreader coupled to the first device housing a first distance from the first support surface edge and the second device housing a second distance from the second support surface edge and spanning the hinge; and
a flexible display coupled to the first device housing and the second device housing and spanning the hinge;
wherein:
the heat spreader and the flexible display are coupled to the first device housing and the second device housing, respectively, at different locations; and
portions of the heat spreader spanning the hinge are unattached from portions of the flexible display spanning the hinge, thereby causing at least a portion of the flexible display to separate from the first support surface of the first device housing within the first distance from the first support surface edge and the second support surface of the second device housing within the second distance from the second support surface edge when the first device housing pivots about the hinge relative to the second device housing to a closed position.

19. The electronic device of claim 18, wherein the heat spreader is attached to the first device housing and second device housing at locations closer to the hinge than other locations where the flexible display is coupled to the first device housing and the second device housing.

20. The electronic device of claim 19, further comprising heat generating electronics thermally coupled to one or both of the first device housing and/or the second device housing.

\* \* \* \* \*